US009871076B2

(12) United States Patent
Toh et al.

(10) Patent No.: US 9,871,076 B2
(45) Date of Patent: Jan. 16, 2018

(54) DOMAIN WALL MAGNETIC MEMORY

(71) Applicant: GLOBALFOUNDRIES Singapore Pte. Ltd., Singapore (SG)

(72) Inventors: Eng Huat Toh, Singapore (SG); Xuan Anh Tran, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/091,551

(22) Filed: Apr. 5, 2016

(65) Prior Publication Data

US 2017/0287978 A1    Oct. 5, 2017

(51) Int. Cl.
| | | |
|---|---|---|
| *H01L 27/22* | (2006.01) | |
| *H01L 29/66* | (2006.01) | |
| *H01L 43/12* | (2006.01) | |
| *H01L 21/02* | (2006.01) | |

(Continued)

(52) U.S. Cl.
CPC .......... *H01L 27/226* (2013.01); *G11C 11/161* (2013.01); *H01L 21/0257* (2013.01);
(Continued)

(58) Field of Classification Search
CPC ........................ H01L 27/226; H01L 29/66234
See application file for complete search history.

(56) References Cited

U.S. PATENT DOCUMENTS

| | | | | |
|---|---|---|---|---|
| 2010/0237319 | A1* | 9/2010 | Satoh | .................. H01L 45/04 257/5 |
| 2013/0121056 | A1* | 5/2013 | Liu | .................. G11C 11/56 365/148 |

(Continued)

OTHER PUBLICATIONS

T. Suzuki et al., "Low-Current Domain Wall Motion MRAM with Perpendicularly Magnetized CoFeB/MgO Magnetic Tunnel Junction and Underlying Hard Magnets", Symposium on VLSI Technology Digest of Technical Papers, 2013, Japan.

(Continued)

*Primary Examiner* — Marc Armand
*Assistant Examiner* — Shannon Yi
(74) *Attorney, Agent, or Firm* — Horizon IP PTE. Ltd.

(57) ABSTRACT

Devices and methods of forming a device are disclosed. The method includes providing a substrate with a cell region. Selector units and storage units are formed within the substrate. The selector unit includes first and second bipolar junction transistors (BJTs). The selector unit includes first and second bipolar junction transistors (BJTs). A BJT includes first, second and third BJT terminals. The second BJT terminals of the first and second BJTs are coupled to or serve as a common wordline terminal. The third BJT terminal of the first BJT serves as a first bitline terminal, and the third BJT terminal of the second BJT serves as a second bitline terminal. A storage unit is disposed over the selector unit. The storage unit includes a first pinning layer which is coupled to the first BJT terminal of the first BJT, a second pinning layer which is coupled to the first BJT terminal of the second BJT, a free layer which includes an elongated member with first and second major surfaces and first and second end regions separated by a free region. The first pinning layer is coupled to the second major surface of the free layer in the first end region and the second pinning layer is coupled to the second major surface of the free layer in the second end region. A reference stack is disposed on the first major surface of the free layer in the free region. The reference stack serves as a read bitline terminal.

24 Claims, 35 Drawing Sheets

(51) Int. Cl.
　　　H01L 21/768　　(2006.01)
　　　H01L 43/08　　(2006.01)
　　　H01L 43/02　　(2006.01)
　　　G11C 11/16　　(2006.01)
　　　H01L 23/528　　(2006.01)

(52) U.S. Cl.
　　　CPC ...... *H01L 21/02636* (2013.01); *H01L 21/768* (2013.01); *H01L 23/528* (2013.01); *H01L 29/66234* (2013.01); *H01L 43/02* (2013.01); *H01L 43/08* (2013.01); *H01L 43/12* (2013.01)

(56) References Cited

U.S. PATENT DOCUMENTS

| | | | | |
|---|---|---|---|---|
| 2014/0198565 A1* | 7/2014 | Pellizzer | ................ | H01L 45/06 365/163 |
| 2014/0241049 A1* | 8/2014 | Vimercati | .......... | G11C 13/0028 365/163 |
| 2014/0264244 A1* | 9/2014 | Hong | ................. | H01L 27/2436 257/4 |
| 2015/0243885 A1* | 8/2015 | Sciarrillo | ............ | H01L 45/1233 257/2 |

OTHER PUBLICATIONS

S. Fukami et al., "High-speed and reliable domain wall motion device: Material design for embedded memory and logic application", Symposium on VLSI Technology Digest of Technical Papers, 2012, IEEE, Japan.

Noboru Sakimura et al., "A 90nm 20MHz Fully Nonvolatile Microcontroller for Standby-Power-Critical Applications, Mobile Systems-On-Chip (SoCs) 10.5", 2014, Session 10, IEEE International Solid-State Circuits Conference, Japan.

R.C. Sousa et al., "Vertical Integration of Spin Dependent Tunnel Junction and Amorphous Diode for MRAM Application", 1999, IEEE Transactions on Magnetics, Portugal.

Yun Heub Song et al., "Bidirectional Two-Terminal Switching Device for Crossbar Array Architecture, IEEE Electron Device Letters", Aug. 2011, vol. 32, No. 8, Korea.

P. Alpuim et al., "Doping of amorphous and microcrystalline silicon films deposited at low substrate temperatures by hot-wire chemical vapor deposition", Journal of Vacuum Science & Technology A, 2001, AVS, Portugal.

Sungjin Whang et al., "Novel 3-Dimensional Dual Control-Gate with Surrounding Floating-Gate (DC-SF) NAND Flash Cell for 1Tb File Storage Application", Electron Devices Meeting, Dec. 2010, IEEE.

Myoung-Jae Lee et al., "2-stack 1D-1R Cross-point Structure with Oxide Diodes as Switch Elements for High Density Resistance RAM Applications", Electron Devices Meeting, 2007, IEEE.

G.S.Kar et al., "Novel bi-layer poly-silicon channel vertical Flash cell for ultrahigh density 3D SONOS NAND technology", Memory Workshop (IMW), 2011, IEEE.

* cited by examiner

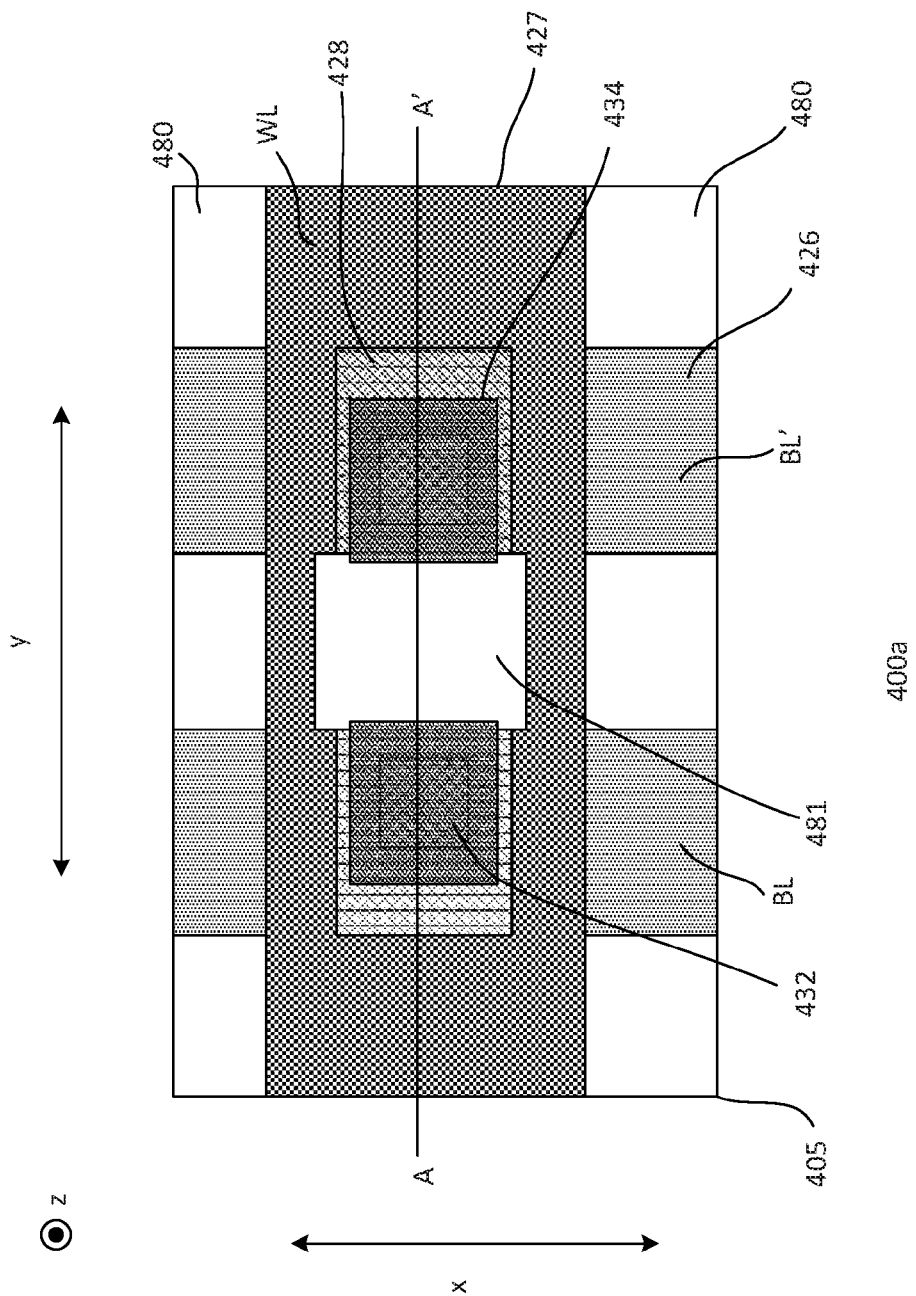
Fig. 4a₁

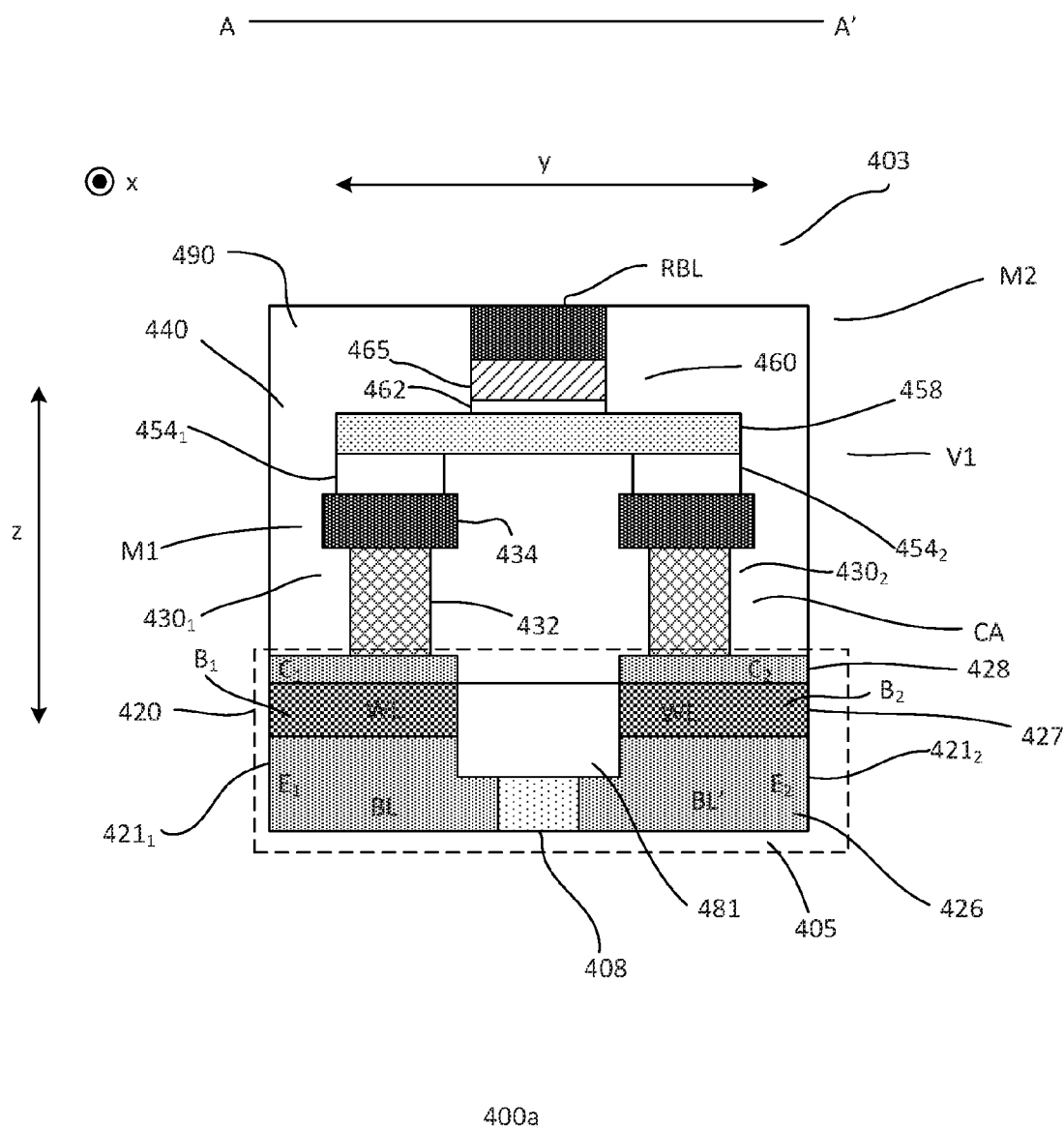
Fig. 4a₂

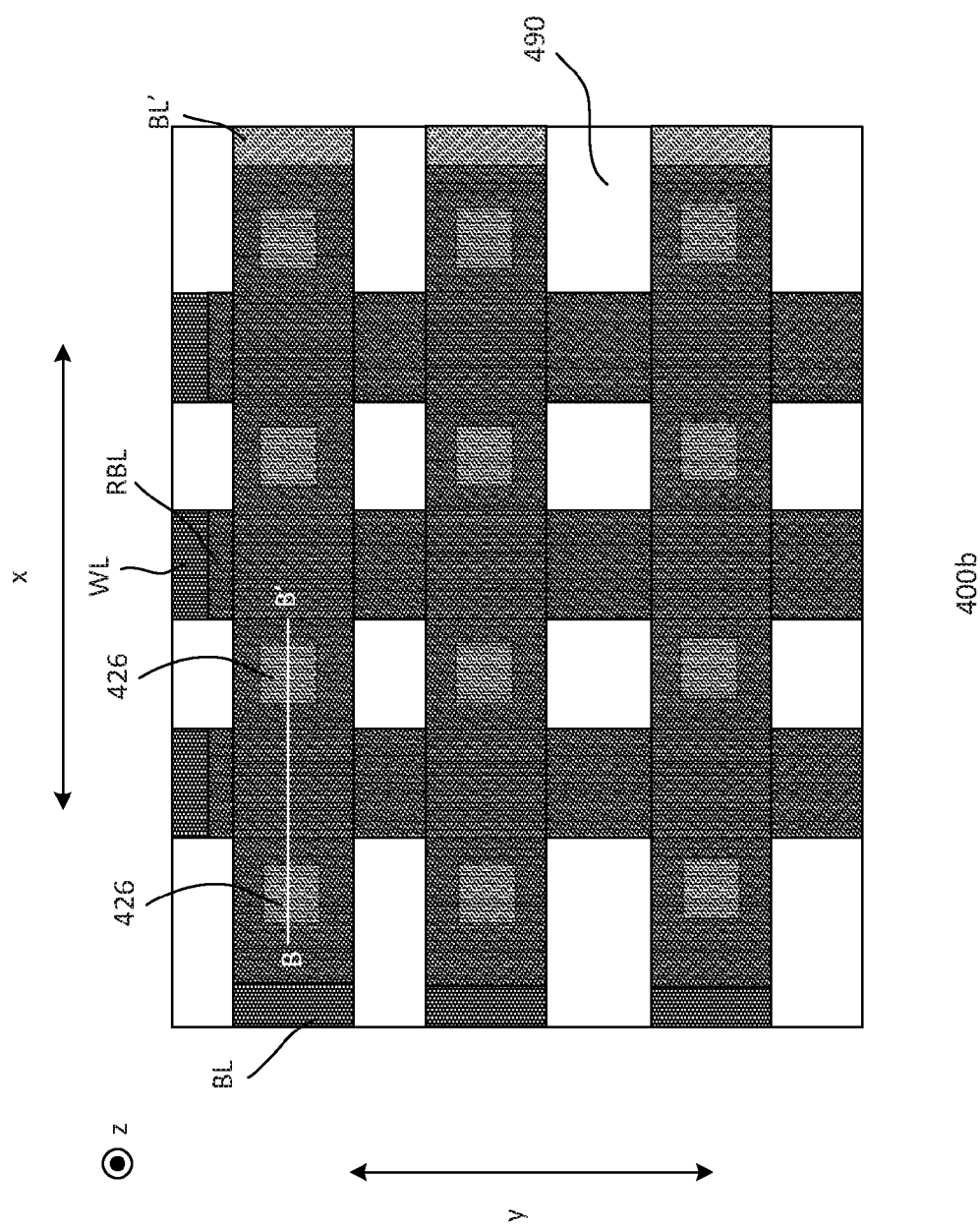
Fig. 4b₁

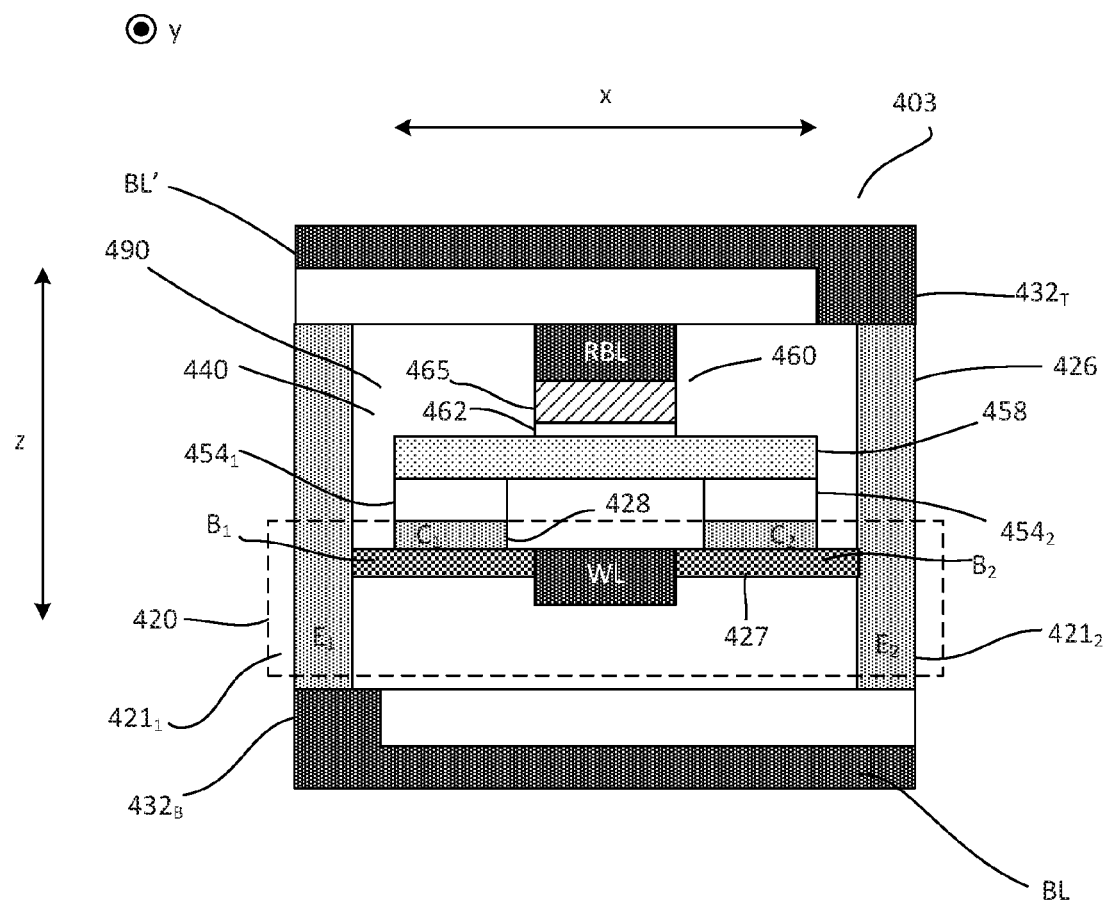
Fig. 4b₂

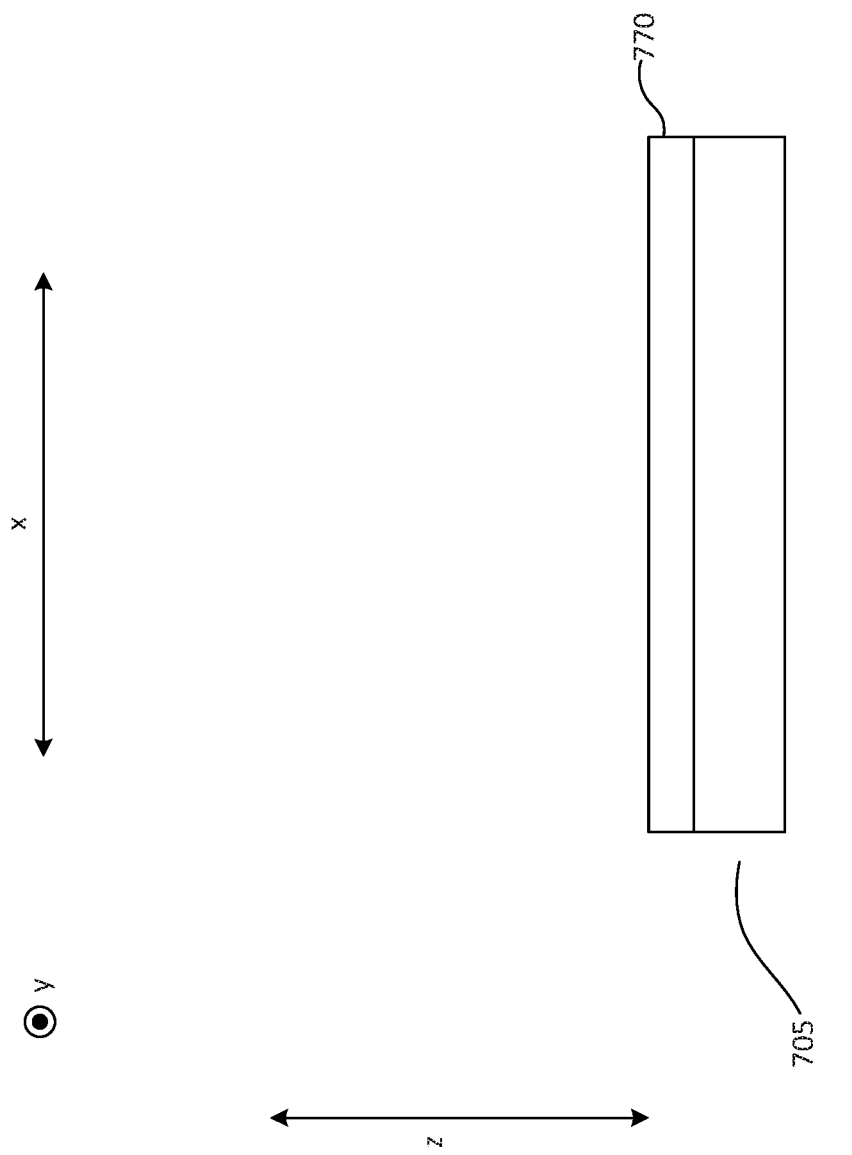

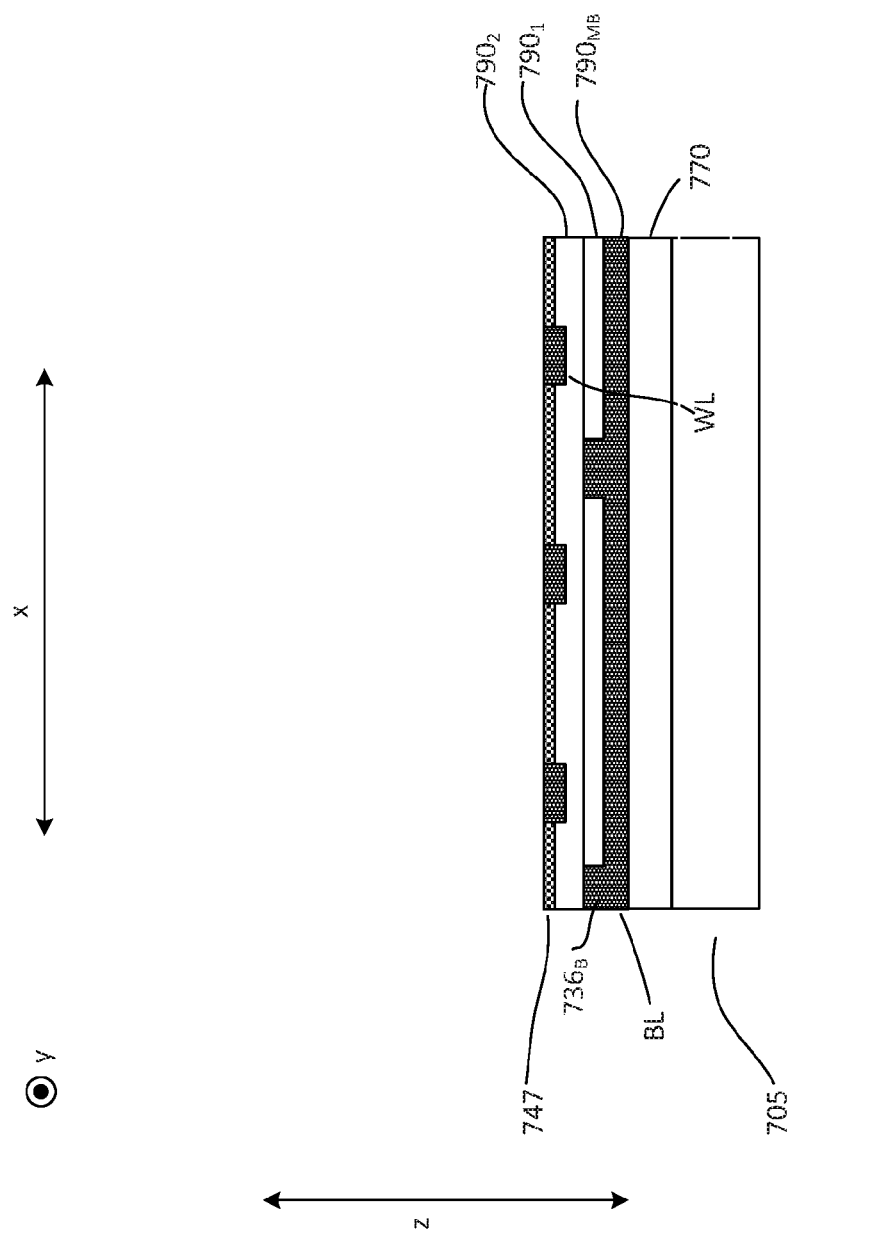

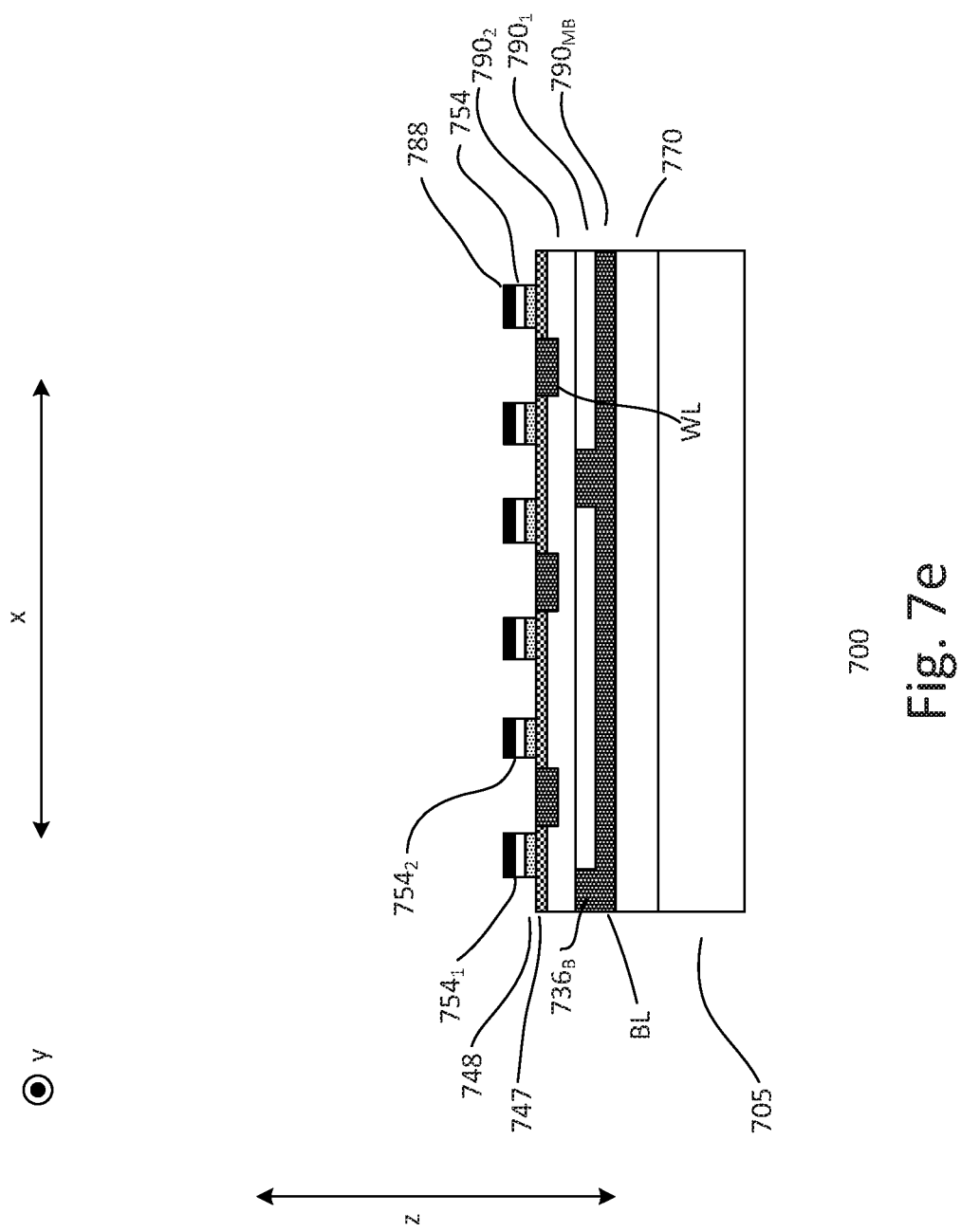

ps://fanyv88.com:443/https/us/9,871,076 B2

DOMAIN WALL MAGNETIC MEMORY

BACKGROUND

A magnetic memory cell stores information by changing electrical resistance of a magnetic tunnel junction (MTJ) element. The MTJ element typically includes a fixed (pinned) magnetic layer and a free magnetic layer. The fixed (pinned) magnetic layer and the free layer are laminated such that a tunnel barrier film forms between the two layers. The magnetic orientation of the free layer flips by a direction or an opposite direction of electric currents exceeding a critical select current. The electrical resistance of the MTJ element changes corresponding to the magnetic orientation of the free layer relating to the fixed magnetic layer, which may be in either a parallel state or an anti-parallel state.

However, conventional magnetic memory cells require high currents for programming. This results in a high power consumption. Additionally, magnetic memory cells suffer from low sensing margin. Low sensing margin creates reliability issues.

From the foregoing discussion, it is desirable to provide compact and high density low power memory cells with high sensing margin.

SUMMARY

Embodiments of the present disclosure generally relate to semiconductor devices. More particularly, some embodiments relate to memory devices, such as magnetic memory devices. For example, the magnetic memory devices may be spin transfer torque magnetoresistive random access memory (STT-MRAM) devices. Such memory devices, for example, may be incorporated into standalone memory devices including, but not limited to, Universal Serial Bus (USB) or other types of portable storage units, or integrated circuits (ICs), such as microcontrollers or system on chips (SoCs). The devices or ICs may be incorporated into or used with, for example, consumer electronic products, or relate to other types of devices.

In one embodiment, a method for forming a memory cell is disclosed. The method includes providing a substrate with a cell region. A selector unit is formed in the cell region. The selector unit includes first and second bipolar junction transistors (BJTs). A BJT includes first, second and third BJT terminals. The second BJT terminals of the first and second BJTs are coupled to or serve as a common wordline terminal, the third BJT terminal of the first BJT serves as a first bitline terminal, and the third BJT terminal of the second BJT serves as a second bitline terminal. A storage unit is formed. The storage unit includes a first pinning layer which is coupled to the first BJT terminal of the first BJT, a second pinning layer which is coupled to the first BJT terminal of the second BJT, a free layer which includes an elongated member with first and second major surfaces and first and second end regions separated by a free region, where the first pinning layer is coupled to the second major surface of the free layer in the first end region and the second pinning layer is coupled to the second major surface of the free layer in the second end region, and a reference stack is disposed on the first major surface of the free layer in the free region. The reference stack serves as a read bitline terminal.

In another embodiment, a memory cell is presented. The method cell includes a substrate with a cell region. A selector unit is disposed in the cell region. The selector unit includes first and second bipolar junction transistors (BJTs). A BJT includes first, second and third BJT terminals. The second BJT terminals of the first and second BJTs are coupled to or serve as a common wordline terminal, the third BJT terminal of the first BJT serves as a first bitline terminal, and the third BJT terminal of the second BJT serves as a second bitline terminal. A storage unit is disposed over the selector unit. The storage unit includes a first pinning layer which is coupled to the first BJT terminal of the first BJT, a second pinning layer which is coupled to the first BJT terminal of the second BJT, a free layer which includes an elongated member with first and second major surfaces and first and second end regions separated by a free region disposed over the pinning layers, where the first pinning layer is coupled to the second major surface of the free layer in the first end region and the second pinning layer is coupled to the second major surface of the free layer in the second end region, and a reference stack disposed on the first major surface of the free layer in the free region. The reference stack serves as a read bitline terminal.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

Figure 5A:
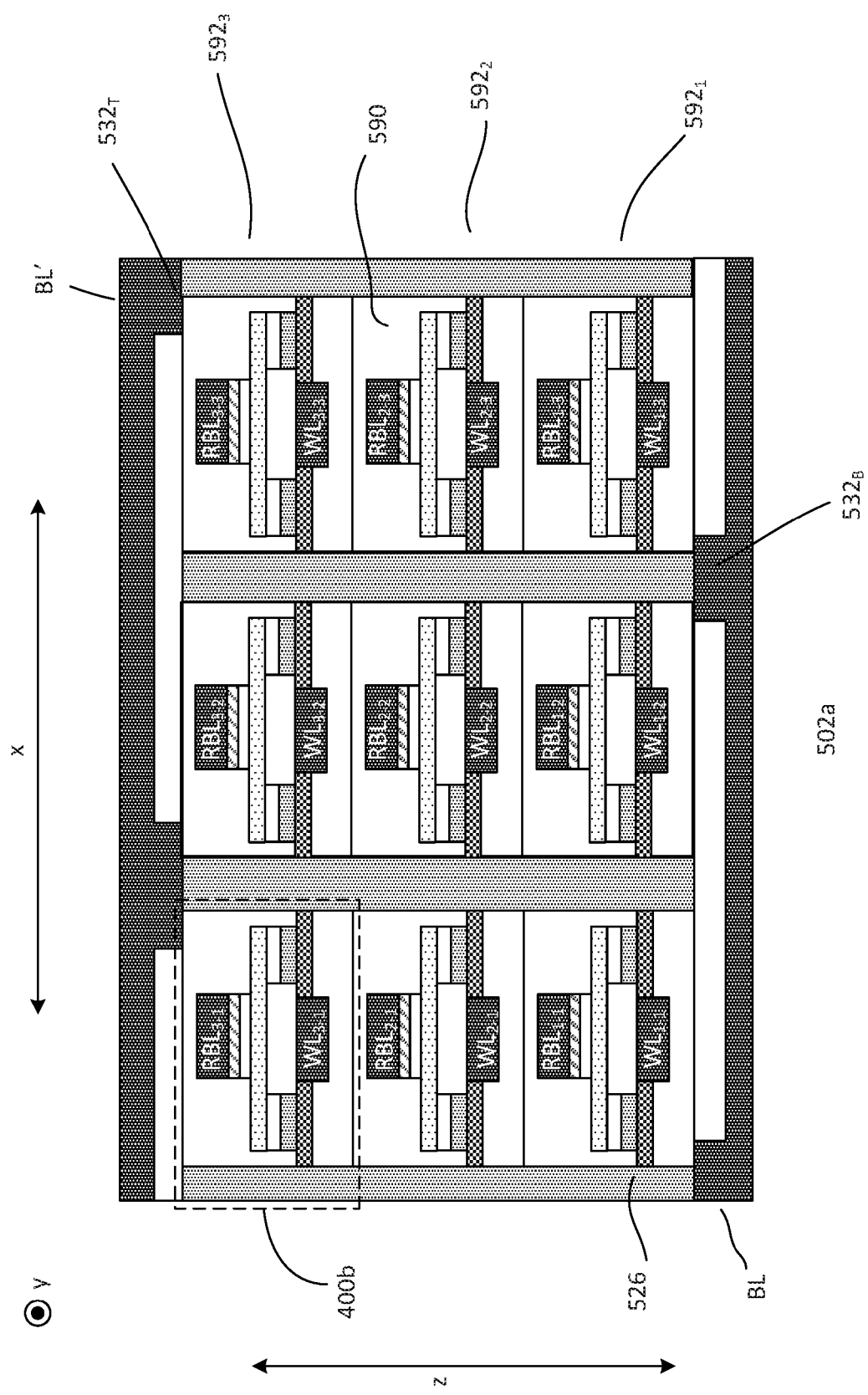
Figure 5B:
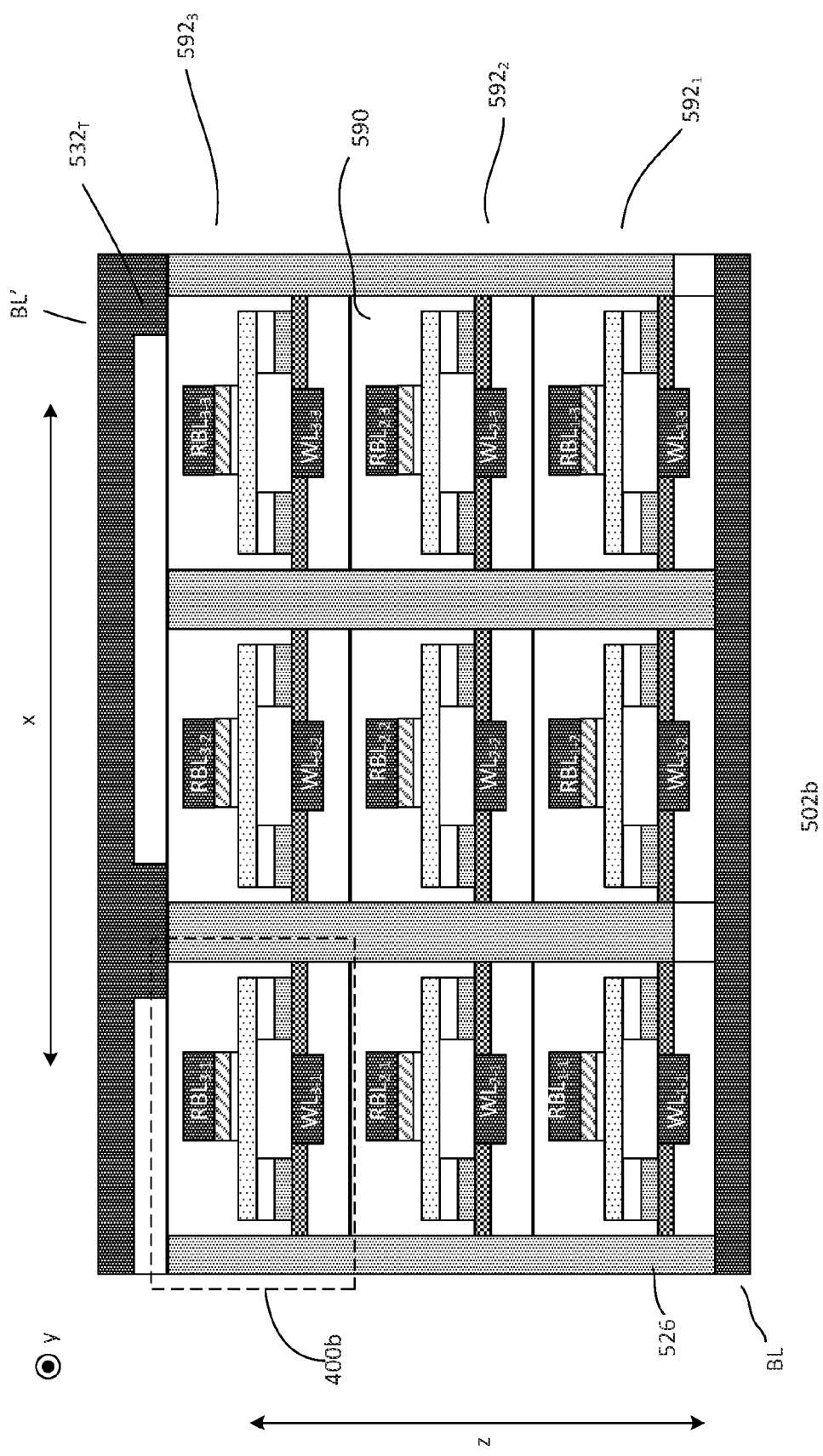
Figure 5C:
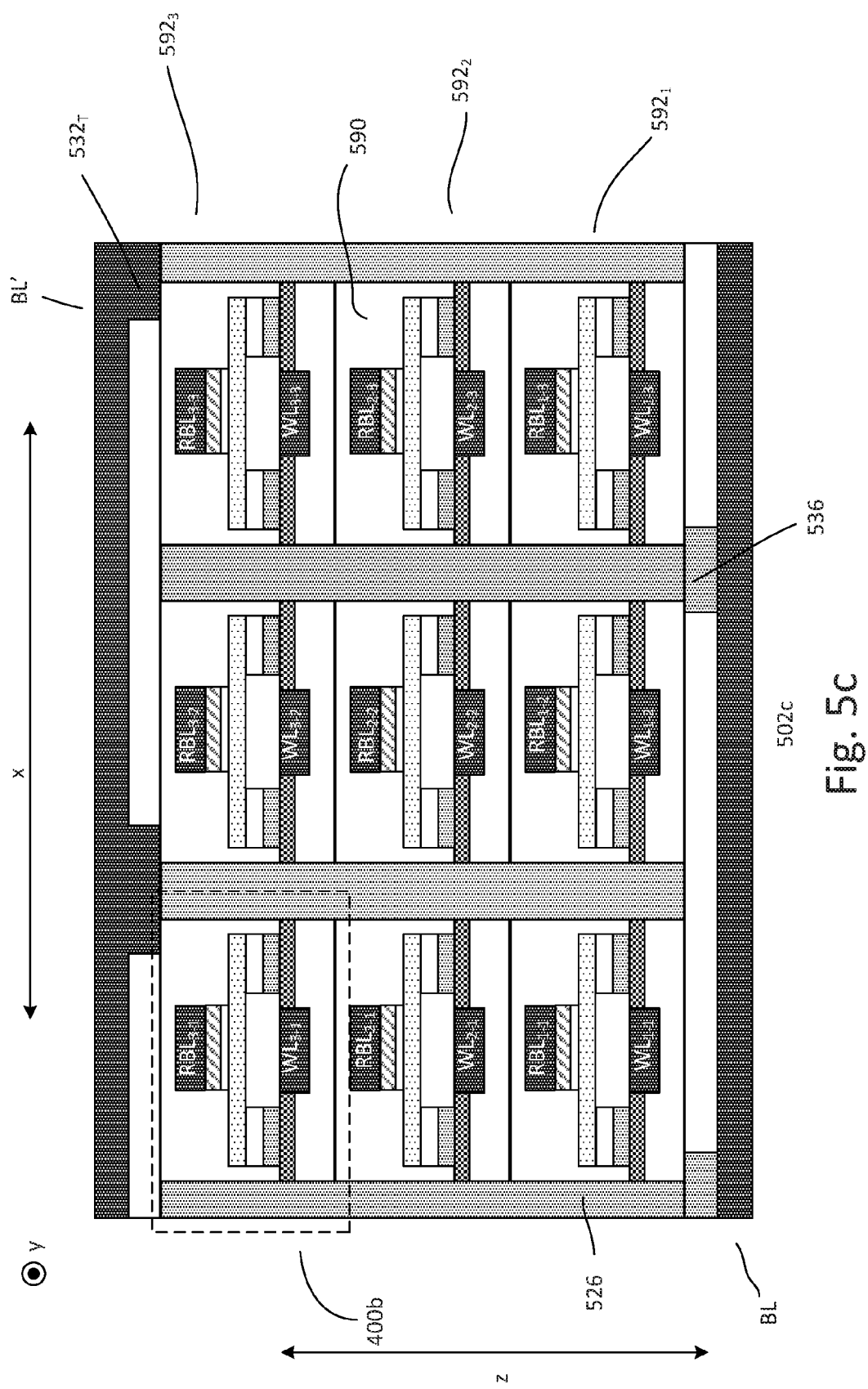

FIGS. $4a_1$-$4a_2$ and $4b_1$-$4b_2$ show top and cross-sectional views of embodiments of domain wall magnetic memory cells;

FIGS. 5a-5c show cross-sectional views of various memory arrays with domain wall magnetic memory cells;

FIGS. 6a-6h show an embodiment of a process for forming a domain wall magnetic memory cell; and FIGS. 7a-7k show an embodiment of a process for forming an array of domain wall magnetic memory cells.

DETAILED DESCRIPTION

Embodiments of the present disclosure generally relate to memory cells. In one embodiment, the memory cells are magnetic resistive memory cells. Magnetic resistive memory cells include magnetic tunneling junction (MTJ) elements. In one embodiment, the memory cells include domain wall (DW) magnetic elements. Other types of resistive memory cells may also be useful. The memory cells are incorporated into a device, such as an integrated circuit (IC). The IC may be a dedicated magnetic memory IC or an embedded IC with memory cells.

Figure 1:
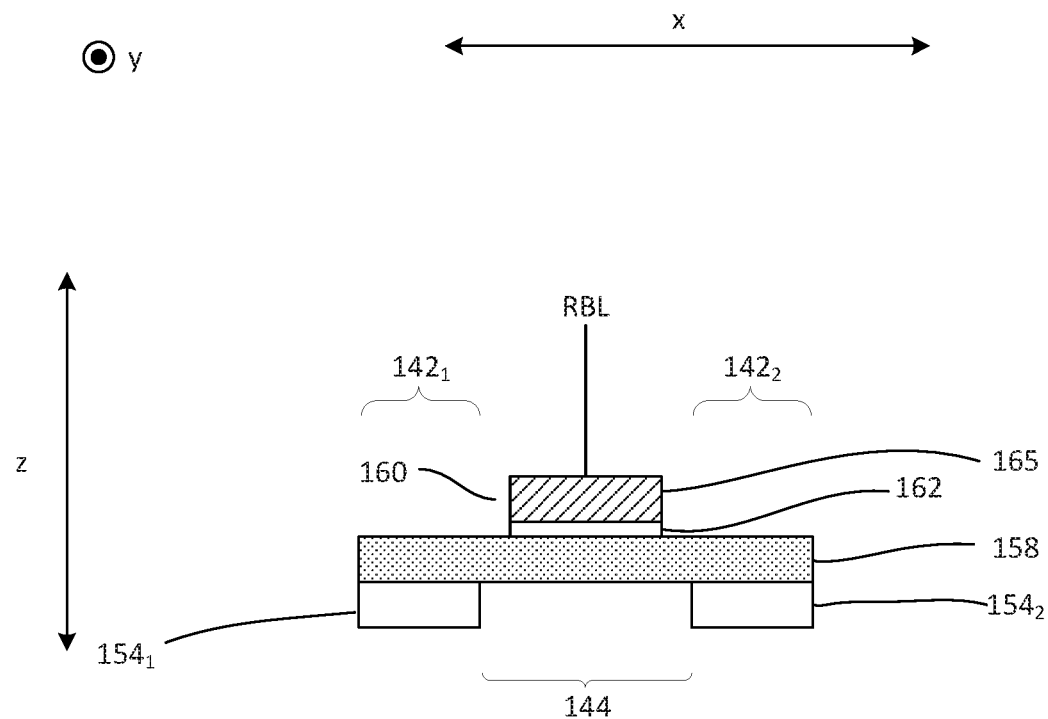
FIG. 1 shows a simplified cross-sectional view of a domain wall magnetic element.

FIG. 1 shows a simplified cross-sectional view of an embodiment of a DW magnetic element 140 of, for example, a DW magnetic memory cell. The magnetic element includes a free layer 158. The free layer, for example, is a CoFeB free layer. Other types of free layers may also be useful. The free layer is, for example, an elongated free layer disposed along a first or x direction. The x direction is a first horizontal direction which is parallel to a surface of a wafer or substrate on which the device is formed. The x direction, for example, is the bitline direction while a second horizontal or y direction is the wordline direction. Providing the x direction as the wordline direction and y direction as the bitline direction may also be useful. The free layer includes top and bottom major surfaces. The top surface is distal from the substrate while the bottom surface is proximate to the substrate. The free layer can have its magnetization switched between first and second magnetization directions. In one embodiment, the magnetization direction in the free layer is configured in a vertical or z direction. The vertical direction is perpendicular to the surface of the substrate. The first magnetization direction may be in the +z (upwards) direction while the second magnetization direction may be in the −z (downwards) direction.

The free layer 158 is separated into a first end region $142_1$, a second end region $142_2$ and a third intermediate/free region 144 along the first direction. As shown, the third intermediate region is disposed between the first and second end regions. In one embodiment, first and second magnetic pinning layers $154_1$ and $154_2$ are disposed below free layer. As shown, the pinning layers are disposed on the bottom surface of the free layer at the first and second end regions. For example, the first pinning layer is disposed on the bottom surface of the free layer under the first end region and the second pinning layer is disposed on the bottom surface of the free layer under the second end region. The pinning layers pin the magnetization of the end regions of the free layer in a fixed magnetization direction. The pinning layers, for example, serve as hard magnets to pin the end regions of the free layer in a fixed magnetization direction.

The pinning layers form first and second fixed regions in the first and second end regions. In one embodiment, the first and second fixed regions have opposite magnetization directions. For example, the first pinning layer fixes the magnetization of the first fixed region in the first magnetization direction (+z) and the second pinning layer fixes the magnetization of the second fixed region in the second magnetization direction (−z). Various types of pinning layers may be employed. In one embodiment, the pinning layer includes a Co—Pt alloy layer or laminated film. Other types of pinning layers may also be useful.

In the free layer 158, the magnetization can be switched from the first to the second magnetization directions based on a programming current flowing through the free layer between the first and the second end regions. For example, the programming current flows through the free layer between the first and second pinning layers. The first and second pinning layers, for example, serve as first and second terminals of the magnetic memory element.

A reference stack 160 is disposed on the top surface of the free layer. The reference stack, in one embodiment, is disposed on the top surface of the free layer within the free region. The reference stack includes a reference layer 165 disposed over a tunneling barrier layer 162. The reference layer is a magnetic layer. In one embodiment, the reference layer has its magnetization configured in the first magnetization direction. The first magnetization, as shown, is in the +z or upwards direction. Providing the first magnetization which is in the −z or downwards direction may also be useful. As for the tunneling barrier layer, it may have the same width (along x-direction) as, or extend beyond, the magnetic layer. For example, the tunneling barrier layer is disposed on the whole top surface of the free layer. The reference layer, for example, may be a Co/Pt laminated layer. Other types of reference layers may also be useful. The tunneling barrier layer 162, for example, is a MgO layer. Other types of tunneling barrier layers may also be useful. The reference stack and free layer form a MTJ of the magnetic element. Although as shown, the tunneling barrier layer has sidewalls which are coextensive with that of the reference layer, it is understood that the tunneling barrier layer may extend over the free layer beyond the sidewalls of the reference layer. In one embodiment, the reference layer serves as a read port of the memory element. For example, read operations are performed through the read port. A read bitline (RBL) is coupled to the read port of the magnetic element. For example, the RBL is coupled to the reference layer 165 of the magnetic memory element.

Figure 2A:
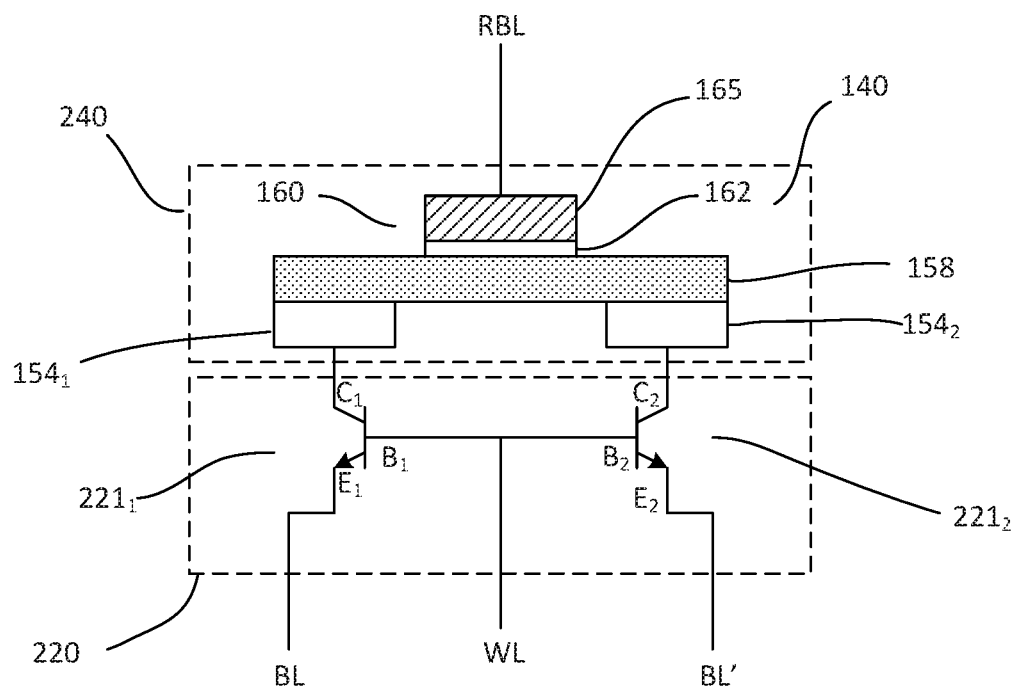
FIGS. 2a-2d show simplified views of embodiments of domain wall magnetic memory cells.

FIG. 2a shows a schematic diagram of an embodiment of a memory cell 200. The memory cell is a non-volatile memory cell. For example, the memory cell may be a magnetic memory cell. In one embodiment, the memory cell is a magnetic memory cell with a DW magnetic element. The memory cell includes a storage unit 240 and a cell selector unit 220. The storage unit, in one embodiment, includes a DW magnetic element 140 as described in FIG. 1. Common elements may not be described or described in detail.

The selector 220 is coupled to the storage unit 240. The selector unit includes first and second selectors $221_1$ and $221_2$. The first selector is coupled to the first terminal of the DW magnetic element d the second selector is coupled to the second terminal of the DW magnetic element. For example, the first selector 221 is coupled to the first pinning layer $154_1$ and the second selector $221_2$ is coupled to the second pinning layer $154_2$.

In one embodiment, the selectors are bipolar junction transistors (BJTs). In one embodiment, the selectors are NPN BJTs. Other types of BJTs may also be useful. A BJT includes first, second and third terminals. For example, a BJT includes a collector terminal C, a base terminal B and an emitter terminal E. For an NPN BJT, the collector terminal C is n-type, the base terminal B is p-type and the emitter terminal E is n-type.

As shown, the collector terminals are coupled to the pinning layers of the magnetic element. For example, a first collector terminal $C_1$ of the first selector $221_1$ is coupled to the first pinning layer $154_1$ and the second collector terminal $C_2$ of the second selector $221_2$ is coupled to the second pinning layer $154_2$. A first emitter terminal $E_1$ is coupled to a first bitline (BL) and a second emitter terminal $E_2$ is coupled to a second bitline (BL'). The first bitline is, for example, a true bitline BL and the second bitline is a complement bitline BL' of a bitline pair. The collector and emitter terminals may be interchangeable. The first and second bases $B_1$ and $B_2$ of the first and second selectors are commonly coupled to a wordline (WL). A read bitline (RBL) is coupled to the read port of the magnetic element. For example, the RBL is coupled to the reference layer 165 of the magnetic element.

In one embodiment, BL and BL' are disposed below the memory cell. By below, it refers to the bitlines BL and BL' being disposed below the memory cell on the substrate on which the device is formed. The bitlines may be disposed in the x direction while the wordline is disposed along the y direction. Other configurations of wordlines and bitlines may also be useful.

Figure 2B:
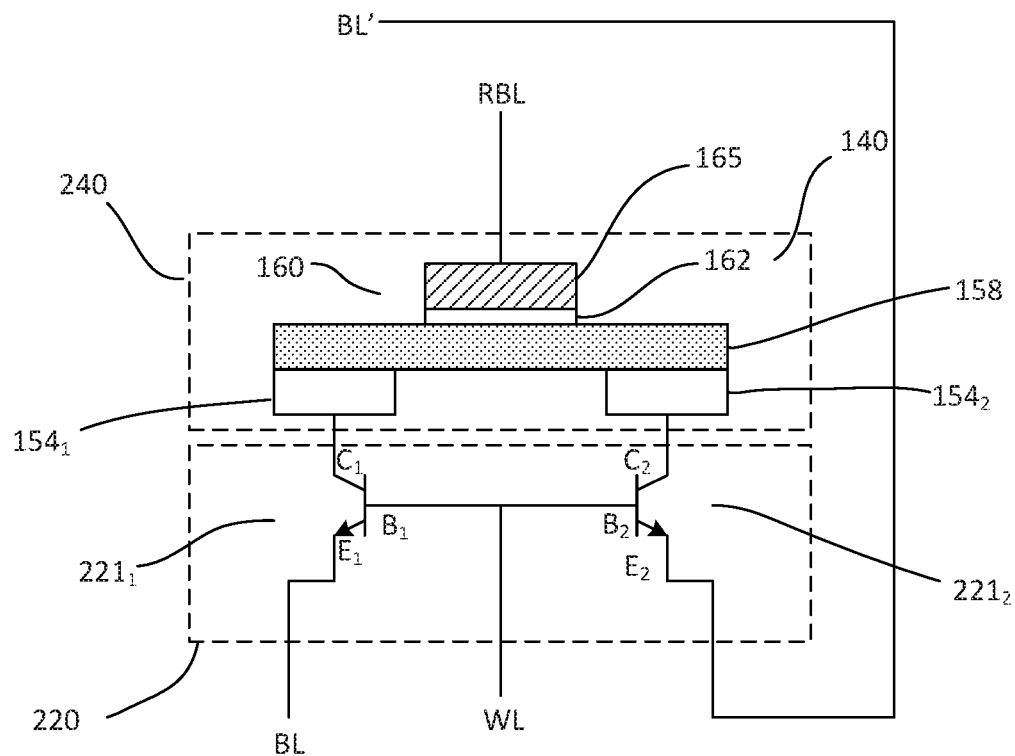

FIG. 2b shows an alternative embodiment of a memory cell. The memory cell includes common elements shown in FIG. 2a. Common elements may not be described or described in detail. As shown in FIG. 2b, one bitline of the bitline pair is disposed below the memory cell while the other bitline of the bitline pair is disposed above the memory cell. For example, BL is disposed below the memory cell while BL' is disposed above the memory cell. Providing BL' below the memory cell and BL above the memory cell may also be useful.

Figure 2C:
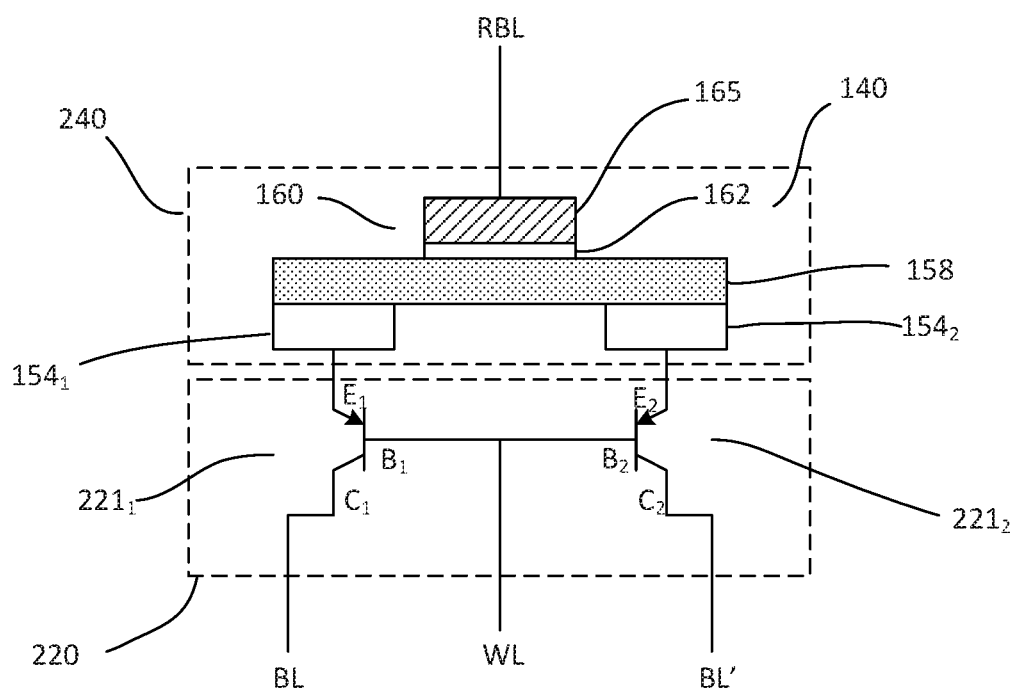
Figure 2D:
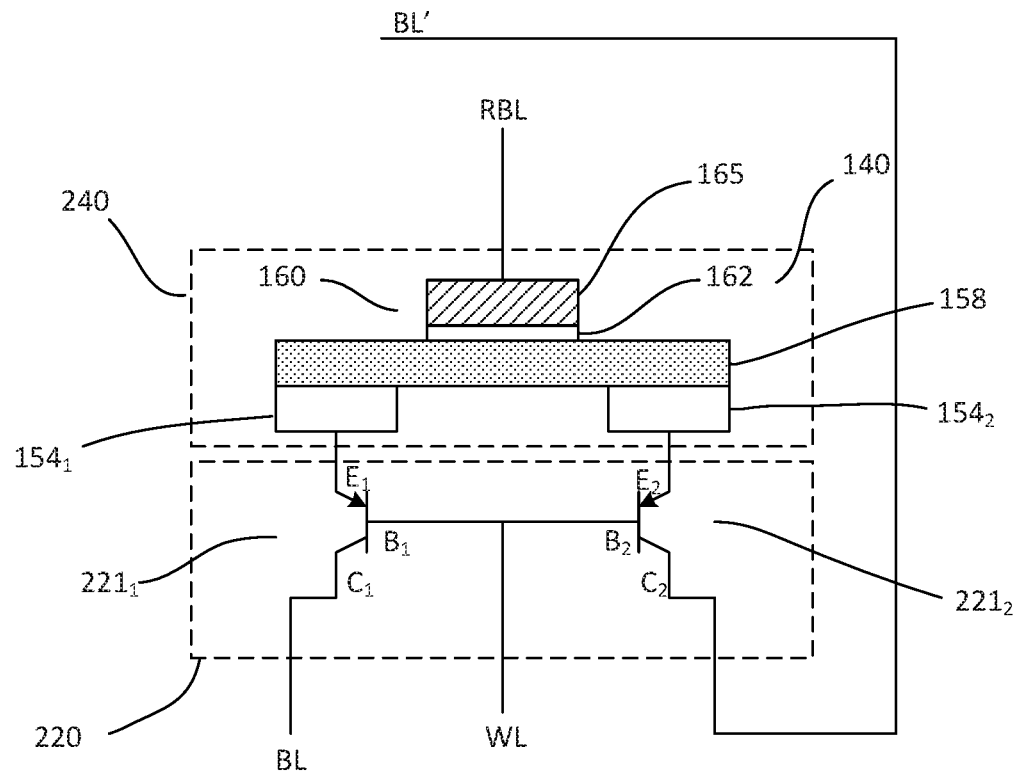

FIGS. 2c-2d show other embodiments of memory cells 200. The memory cells are similar to those described in FIGS. 2a-2b. Common elements may not be described or described in detail. As shown, the memory cell of FIG. 2c is similar to that of FIG. 2a and the memory cell of FIG. 2d is similar to that of FIG. 2b except that the selectors $221_1$ and $221_2$ are PNP BJTs. For a PNP BJT, the collector terminal C is p-type, the base terminal B is n-type and the emitter terminal E is p-type. In the case of PNP BJTs, the emitter terminals $E_1$ and $E_2$ are coupled to the pinning layers $154_1$-$154_2$. The emitter and collector terminals may be interchangeable.

Figure 3A:
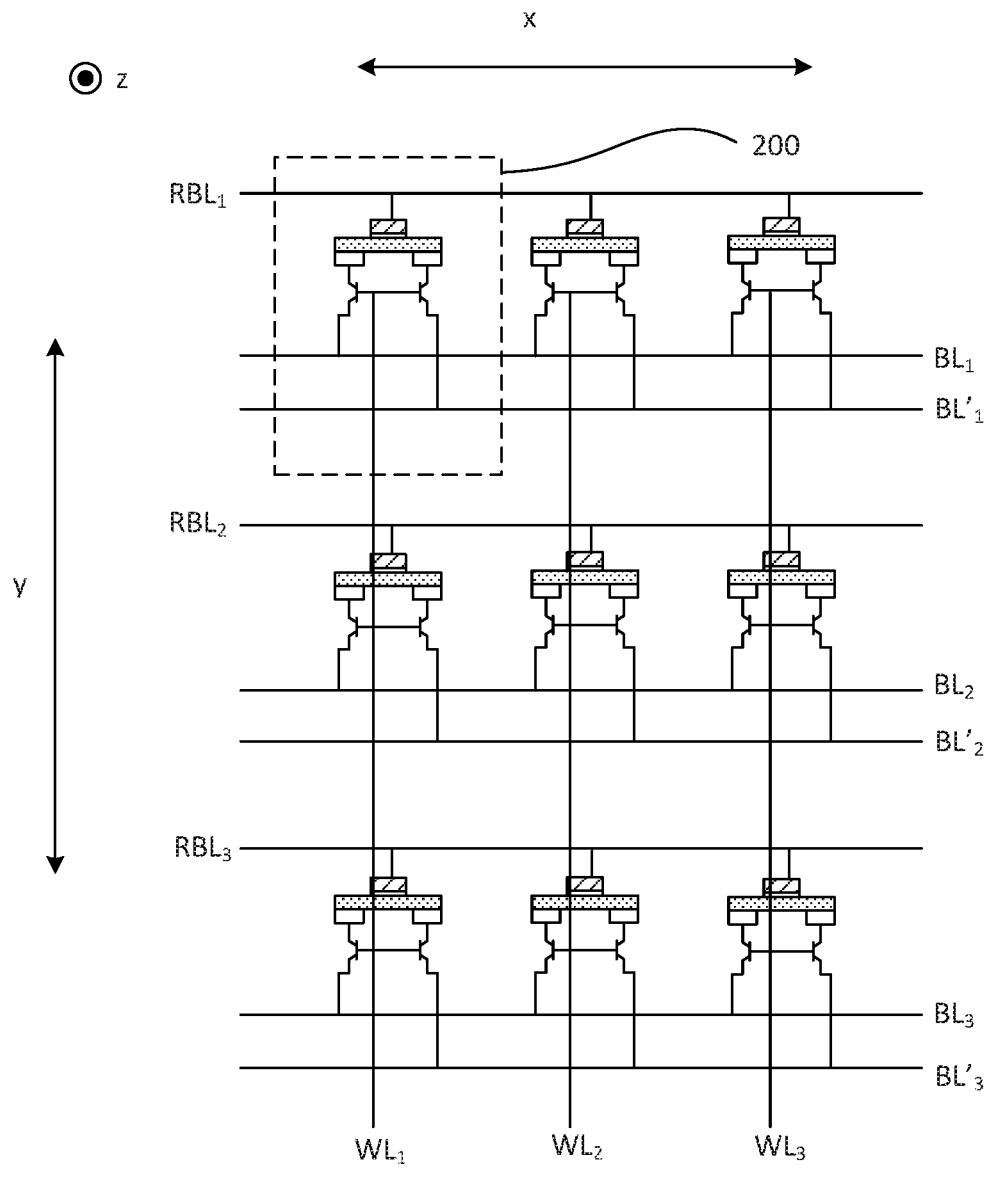
FIGS. 3a-3d illustrate simplified memory arrays with domain wall magnetic memory cells.

FIG. 3a shows a schematic diagram of an embodiment of a memory array 300. The array includes a plurality of interconnected memory cells 200. The memory cells may be similar to those described in FIGS. 2a and 2c. Common elements may not be described or described in detail. Other types of memory cells may also be useful.

In one embodiment, the memory cells are DW magnetic memory cells interconnected by BLs, BL's, WLs and RBLs. The memory cells may have BLs and BL's below the memory cells or one below and one above in the z direction. In addition, the transistors of the select units may either be PNP or NPN type BJTS. Furthermore, the collector and emitter terminals may be interchangeable, as indicated by the lack of emitter symbol.

As shown, the array includes nine memory cells arranged in a 3×3 array. For example, the array is arranged to form three rows and three columns of memory cells. Memory cells of a column re interconnected by a wordline ($WL_1$, $WL_2$ or $WL_3$) in the y direction while memory cells of a row are interconnected by first and second bitlines ($BL_1$ and $BL'_1$, $BL_2$ and $BL'_2$ or $BL_3$ and $BL'_3$) in the x direction. Within a memory cell, various elements are stacked in the z direction. In one embodiment, BL and BL' are disposed below the memory cell in the z direction. Although the array is illustrated as a 3×3 array, it is understood that arrays of other sizes may also be useful.

Figure 3B:
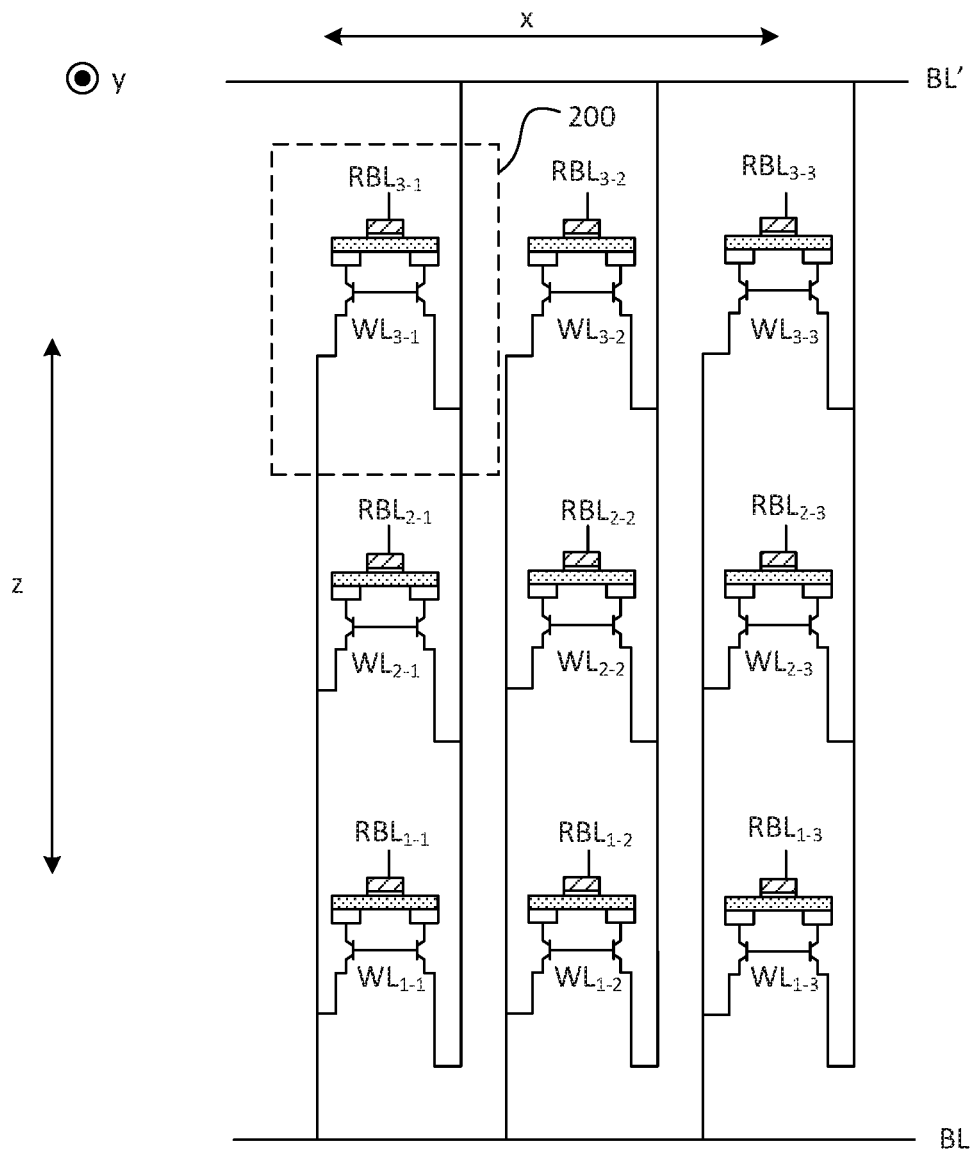

FIG. 3b shows a schematic diagram of another embodiment of a memory array 301. The array includes a plurality of memory cells 200 interconnected by WLs, RBLs, BL and BL'. The memory cells may be similar to those described in FIGS. 2b and 2d. For example, the memory cells are DW magnetic memory cells having one of BL and BL' disposed above the cells while the other one is disposed below the cells in the z direction. Common elements may not be described or described in detail. Other types of cells may also be useful.

As shown, the array includes nine memory cells arranged in a 3×3 array. The memory cells are vertically stacked to form 3 levels in the z direction, each level having 3 memory cells in the x direction. The three levels of memory cells form three columns of memory cells sharing BL and BL' along the x direction. As shown, BL is disposed below the cells while BL' is disposed above the cells in the z direction. Alternatively, BL may be disposed above the cells and BL' may be disposed below the cells. The bitline disposed below the cells may be referred to as a bottom BL and the bitline disposed above the cell may be referred to as a top BL. Each memory cell of the 3×3 array couples to a wordline ($WL_{1-1}$, $WL_{1-2}$, $WL_{1-3}$, $WL_{2-1}$, $WL_{2-2}$, $WL_{2-3}$, $WL_{2-1}$, $WL_{3-2}$ or $WL_{3-3}$) and a RBL ($RBL_{1-1}$, $RBL_{1-2}$, $RBL_{1-3}$, $RBL_{2-1}$, $RBL_{2-2}$, $RBL_{2-3}$, $RBL_{3-1}$, $RBL_{3-2}$ or $RBL_{3-3}$) disposed along the y direction.

Figure 3C:
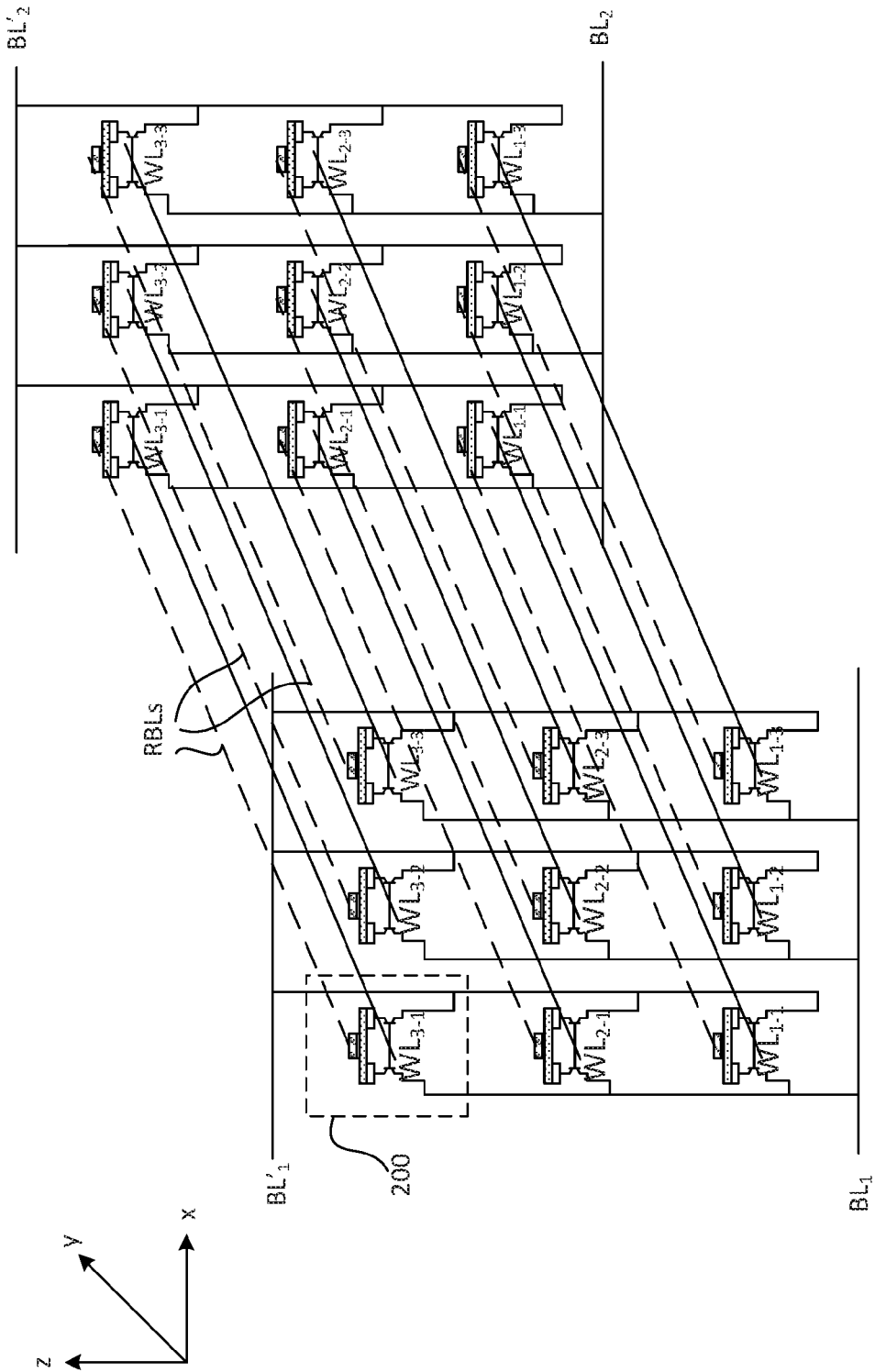
Figure 3D:
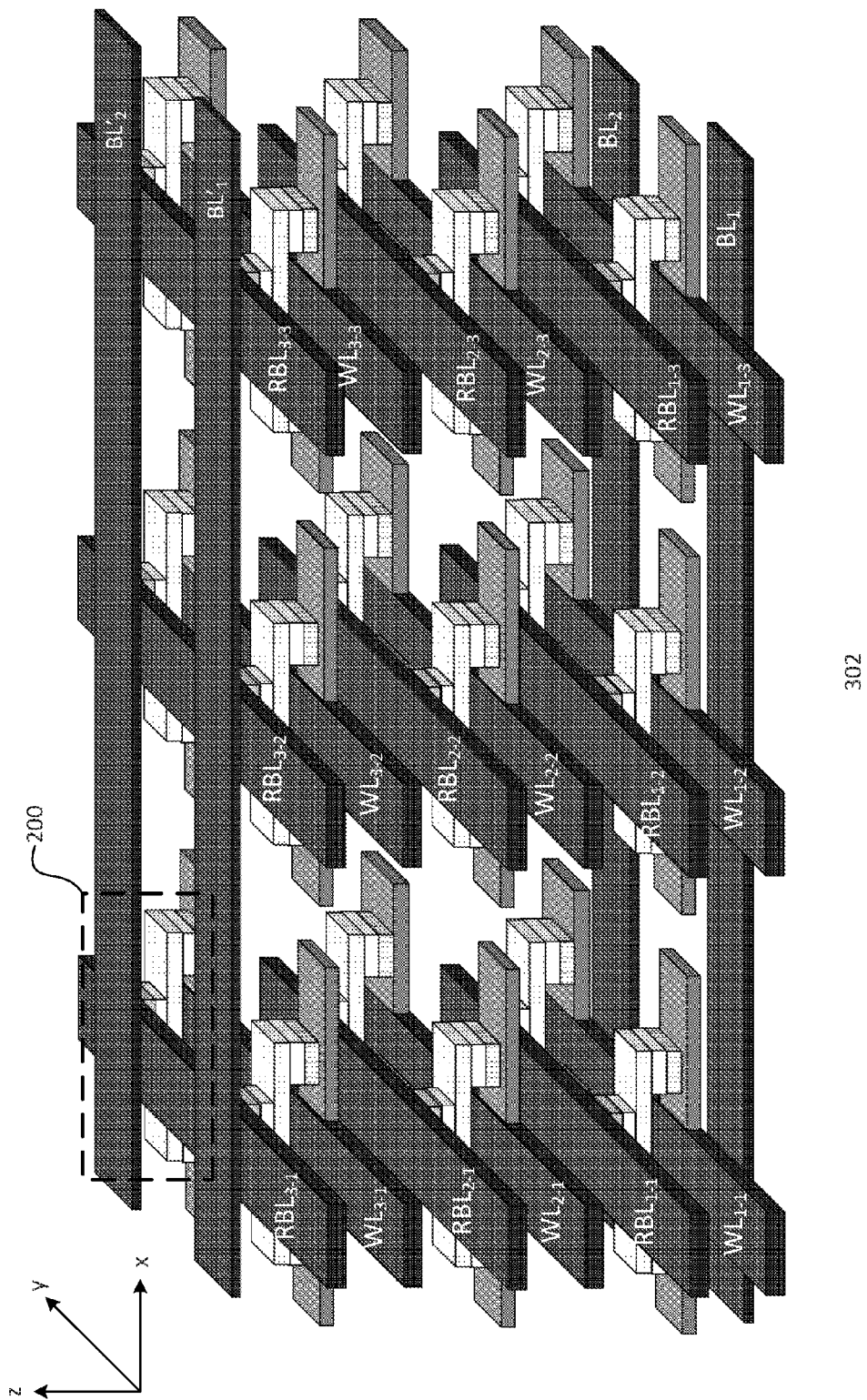

A plurality of memory cells 200 stacked vertically in multiple levels in the z-direction are coupled in the x direction by BLs and BL's and may be interconnected by WLs and RBLs in the y direction forming a three-dimensional array 302, as shown in the simplified 2-dimensional (2-D) stack arrangement as illustrated in FIG. 3c and a simplified 3-dimensional (3-D) stack arrangement as illustrated in FIG. 3d (with the connections coupling to the BLs and BL's being omitted).

Appropriate voltages or biases are applied to the various lines (WLs, BLs, BL's and RBLs) to select the memory cell for different operations. Table 1 below shows various biases applied to the various lines for selected (sel) cells and non-selected (non-sel) cells for different operations:

TABLE 1

| signal operation | BL (sel) | BL (non-sel) | BL' (sel) | BL' (non-sel) | WL (sel) | WL (non-sel) | RBL |
|---|---|---|---|---|---|---|---|
| Write 0 | High (1 V) | Low (0 V) | Low (0 V) | Low (0 V) | High (1 V) | Low (0 V) | Low (0 V) |
| Write 1 | Low (0 V) | Low (0 V) | High or (1 V) | Low (0 V) | High (1 V) | Low (0 V) | Low (0 V) |
| Read | Read High (0.1 V) | Low (0 V) | Low (0 V) | Low (0 V) | High (1 V) | Low (0 V) | Low (0 V) |

The voltages for logic high signals are exemplary and are for memory cell with NPN an type select transistors. Other suitable voltages may also be useful. The actual voltage may vary, for example, depending on design requirements and technology node.

FIGS. $4a_1$-$4a_2$ show top and cross-sectional views of an embodiment of a device 400a. The cross-sectional view, for example, is taken along A-A' in the y or wordline direction of the device. As for the top view, it shows the layout of a unit memory cell 403 up to and including the first metal level, such as M1. The memory cell may be a non-volatile memory (NVM) cell. The memory cell is, for example, a magnetic NVM cell. In one embodiment, the memory cell is a DW magnetic memory cell, such as those described in FIGS. 2a and 2c. Common elements may not be described or described in detail.

The memory cell is disposed on a substrate 405. For example, the memory cell is disposed in a cell region of the substrate. The cell region may be part of an array region. For example, the array region may include a plurality of cell regions. The substrate may include other types of device regions (not shown), such as high voltage (HV) regions as well as logic regions, including low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide (SiO$_2$), which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Isolation regions 480 may be provided. In one embodiment, the isolation regions are shallow trench isolation (STI) regions. Other types of isolation regions may also be useful. The isolation regions are provided to isolate device regions from other regions. In one embodiment, the isolation regions may be provided to isolate columns and rows of memory cells. Other configurations of isolation regions may also be useful.

The cell region may include a cell device well 408 as shown in FIG. 4a$_2$. The cell device well, for example, serves as a body well for a cell selector unit 420 of the memory cell. The device well may be doped with second polarity type dopants for first polarity type selectors. The device well may be lightly or intermediately doped with second polarity type dopants. For example, the device well may have a dopant concentration of about $10^{16}$-$10^{18}$ cm$^{-3}$. Other dopant concentrations may also be useful.

In some cases, a cell device isolation well (not shown) may be provided, encompassing the cell device well. The isolation well may have a dopant type which has the opposite polarity to that of the array well. For example, the isolation well may include first polarity type dopants. The isolation well serves to isolate the cell device well from the substrate. Well biases may be provided to bias the wells. For example, the wells may be biased at ground or 0 V. Biasing the wells at other voltage values may also be useful.

The cell device well may be a common well for the cell regions in the array region. For example, the cell device well may be an array well. The cell device isolation well may serve as an array isolation well. Other configurations of device and isolation wells may also be useful. Other device regions of the device may also include device and/or device isolation wells.

The memory cell includes the cell selector unit 420 coupled to a storage unit 440. The storage unit is similar to that described in FIG. 1. Common elements may not be described or described in detail. Common elements are provided with the same reference number except that the most significant number or digit is changed from 1 to 4.

The cell selector unit 420 is disposed in the cell region of the substrate. The cell selector unit includes first and second selectors 421$_1$ and 421$_2$. The selectors are BJTs. In one embodiment, the BJTs are first type BJTs. A first type refers to the polarity of the emitter and collector of the BJT. For example, an n-type BJT is an NPN BJT while a p-type BJT is a PNP BJT. The first BJT is disposed in a first portion of the cell region and the second BJT is disposed in a second portion of the cell region. Another isolation region 481, such as an STI, is disposed in the cell region, separating the first and second portions of the cell region in which the first and second selectors are disposed. For example, as shown, the isolation region 481 separates the bitlines of the cell.

The BJT includes first, second and third semiconductor layers 426, 427 and 428. The semiconductor layers may be part of the substrate or an epitaxial layer formed on the substrate. In one embodiment, the first and second semiconductor layers are part of the substrate while the third layer is an epitaxial layer. Other configurations of semiconductor layers may also be useful. The semiconductor layers, in one embodiment, are doped semiconductor layers. For example, the semiconductor layers are doped silicon layers, such as doped polysilicon layers. Other types of semiconductor may also be useful. The doped silicon layers may be heavily doped polysilicon layers. The first and third layers are heavily doped first polarity type layers while the second layer is heavily doped with second polarity type dopants. For an n-type BJT, the first polarity type is n-type and the second polarity type is p-type. For a p-type BJT, the first polarity type is p-type and the second polarity type is n-type.

The doped layers serve as terminals for a BJT transistor. For example, the first doped layer serves as a first BJT terminal, the second doped layer serves as a second BJT terminal and the third doped layer serves as a third BJT terminal. The first and third terminals are the emitter and collector terminals while the second terminal is the base terminal. In the case of a p-type BJT, the first terminal is the collector terminal and the third terminal is the emitter terminal. For an n-type BJT, the first terminal is the emitter terminal and the third terminal is the collector terminal. The emitter and collector terminals may be interchangeable.

In one embodiment, the first BJT terminal is coupled to a bitline (BL or BL'), the second terminal is coupled to or serve as WL while the third terminal is coupled to the storage unit. As shown, the first selector is coupled to BL while the second selector is coupled to BL'. For example, the first terminal of the first selector is coupled to BL and the first terminal of the second selector is coupled to BL'.

The base or wordline terminals of the BJTs are commonly coupled. For example, the second doped layer extends from the first BJT to the second BJT. As shown the layer extends beyond the isolation region in the y direction, enabling the second doped layer to be commonly coupled. As shown, the second doped layer extends beyond the sides of the isolation region along the y direction. Extending the second doped layer beyond one side of the isolation region along the y direction is also useful. The wordline serves as a common wordline for a row of memory cells in the y direction. As for the bitlines, they extend the length of a column in the x direction, forming common bitlines for a column of memory cells. Other configurations of selectors and BLs may also be useful.

Disposed over the selector unit is a dielectric layer 490. The dielectric layer, for example, may include interlevel dielectric (ILD) layers. The ILD layer includes a metal level and a contact level. The metal level includes conductors or metal lines while the contact level includes contacts. The conductors and contacts may be formed of metal, such as copper (Cu), copper alloy, aluminum (Al), tungsten (W) or a combination thereof. Other suitable types of metals, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as a reactive ion etch (RIE) may also be employed to form metal lines.

A device may include a plurality of ILD levels. For example, x number of ILD levels may be provided. A metal level of an ILD level may be referred to as M$_i$, where i is the i$^{th}$ ILD level of x ILD levels. A contact level of an ILD level may be referred to as $V_{i-1}$, where i is the $i^{th}$ ILD level of x ILD levels. For the first contact level, it may be referred to as CA.

First and second connector units $430_1$ and $430_2$ are provided in the dielectric layer. The connectors provide electrical connection between the selector unit and storage unit. The connectors, in one embodiment, are disposed in the first ILD level, which include CA or premetal and M1 levels. For example, the connector includes a contact 432 in CA and a metal pad 434 in M1. The contact, for example, is a W contact while the metal pad may be a Cu pad. Other types of conductive materials may also be useful. For example, the conductive materials are compatible with back-end-of-line (BEOL) processing employed to form the device.

As shown, the dielectric layer includes a second ILD level disposed on the first ILD level. The second ILD level includes V1 and M2 levels. The storage unit may be disposed in the V1 level, which may also be referred to as a cell dielectric layer. Providing the storage unit in other ILD levels may also be useful. As shown, the pinning layers $454_1$-$454_2$, the free layer 458 and the reference stack 460, including the tunneling barrier layer 462 and the reference layer 465, which form the storage unit are disposed in the V1 level. In one embodiment, the first pinning layer $454_1$ of the storage unit is disposed over the first metal pad of the first connector unit and the second pinning layer $454_2$ of the storage unit is disposed over the second metal pad of the second connector unit. A RBL is disposed over the reference layer. The RBL is in M2. For example, the RBL is formed of copper. Other types of conductive materials may also be used to form the RBL. The RBL extends along the x direction to form a common RBL for a column of memory cells.

In forming a memory array, a plurality of unit cells are interconnected by BLs, BL's, WLs and RBLs, similar to that shown in FIG. 3a. Additional ILD levels (not shown) may be provided above M2. The total number of ILD levels may be 5. Other number of ILD levels may also be useful. A pad level may be disposed over a top ILD level. The additional ILD levels may include interconnects to various circuit elements. For example, interconnects may be provided to the various terminals of the memory cells as well as other circuit elements. For example, metal WLs and BLs are formed in other ILD levels and are electrically connected to the WL and BL terminals of the memory cell. The metal lines may be provided in other upper ILD levels. The WLs and BLs may be provided in different ILD levels.

A dielectric liner (not shown) may be disposed between ILD levels. The dielectric liner, for example, serves as an etch stop layer. The dielectric liner may be formed of a low-k dielectric. For example, the dielectric liner may be nBLOK. Other types of dielectric materials for the dielectric liner may also be useful.

FIG. $4b_1$-$4b_2$ show top and cross-sectional views of an embodiment of a device 400b. For example, FIG. $4b_1$ shows a top layout of a memory array having a plurality of memory cells (without showing the storage unit) up to and including the second metal level, such as M2 while FIG. $4b_2$ shows the cross-sectional view of a unit memory cell 403 taken along B-B' in the x or bitline direction of the device. The memory cell may be a non-volatile memory (NVM) cell. The memory cell is, for example, a magnetic NVM cell. In one embodiment, the memory cell is a DW magnetic memory cell, such as those described in FIGS. 2b and 2d. Common elements may not be described or described in detail.

The memory cell is disposed on a substrate (not shown). For example, the memory cell is disposed in a cell region of the substrate. The cell region may be part of an array region. For example, the array region may include a plurality of cell regions. The substrate may include other types of device regions (not shown), such as high voltage (HV) as well as logic regions, including low voltage (LV) and intermediate voltage (IV) device regions. Other types of regions may also be provided.

As shown, a dielectric layer 490 is disposed between BL and BL'. The BL and BL' may be formed in metal levels of the device. As shown, BL is disposed below BL'. For example, the top bitline is BL' and the bottom bitline is BL. Other configurations of BL and BL' may also be useful. In one embodiment, the bitlines include step portions. As shown, BL includes an elevated step portion $432_B$ which extends above the top surface of BL while BL' includes a lowered or depressed step portion $432_T$ which extends below the bottom surface of BL'. The step portions are disposed on opposite ends of the cell region along the x or bitline direction. The steps may be a via level of a metal level. For example, the elevated step portion may be a via level above a metal level of the bottom bitline while the depressed step portion may be a via level below the top bitline. The vias may be additional via levels or via levels of ILD levels.

As for the dielectric layer, it may be silicon oxide ($SiO_2$). Other types of dielectric layers may also be useful. The dielectric layer may include a plurality of dielectric layers. Disposed in the dielectric layer is the selector unit 420. The selector unit 420 includes first and second selectors $421_1$-$421_2$. The selectors, in one embodiment, are first type BJTs. The first BJT is disposed in a first portion of the cell region and the second BJT is disposed in a second portion of the cell region. The dielectric layer isolates the first and second portions of the cell region in which the first and second selectors are disposed.

A BJT includes first, second and third semiconductor layers 426, 427 and 428. The semiconductor layers, in one embodiment, are doped semiconductor layers. For example, the semiconductor layers are doped silicon layers, such as doped polysilicon layers. Other types of semiconductor layers may also be useful. The doped silicon layers may be heavily doped polysilicon layers. The first and third layers are heavily doped first polarity type layers while the second doped layer is heavily doped with second polarity type dopants. For an n-type BJT, the first polarity type is n-type and the second polarity type is p-type. For a p-type BJT, the first polarity type is p-type and the second polarity type is n-type.

In one embodiment, the second and third doped layers are configured in a horizontal or x direction and the first layer is configured in a vertical or z direction. The doped layers serve as terminals for a BJT transistor. For example, the first doped layer serves as a first BJT terminal, the second doped layer serves as a second BJT terminal and the third doped layer serves as a third BJT terminal. The first and third terminals are emitter and collector terminals while the second terminal is the base terminal. The emitter and collector terminals may be interchangeable. In the case of a p-type BJT, the first terminal is the collector terminal and the third terminal is the emitter terminal. For a n-type BJT, the first terminal is the emitter terminal and the third terminal is the collector terminal. Other configurations terminals may also be useful.

In one embodiment, the first BJT terminal is coupled to a bitline (BL or BL'), the second terminal is coupled to WL while the third terminal is coupled to the storage unit. As shown, the first selector is coupled to BL while the second selector is coupled to BL'. For example, the first terminal of the first selector is coupled to BL and the first terminal of the second selector is coupled to BL'. Other configurations of selectors and BLs may also be useful.

In one embodiment, the first layer is disposed vertically along the z direction in the dielectric layer. The first layer of the first selector is disposed on a first end of the cell region along the x direction and the first layer of the second selector is disposed on a second end of the cell region along the x direction. The first layer of the first selector is coupled to BL. For example, the first layer of the first selector is coupled to the step portion of BL and isolated from BL' by the dielectric layer. As for the first layer of the second selector, it is coupled to the step portion of BL' and isolated from BL by the dielectric layer. The first layer may be planar with the top surface of the step portion of BL and bottom surface of the step portion of BL'.

The second layer is disposed in the dielectric layer above and isolated from BL by the dielectric layer. First ends of the second layers along the x direction are coupled to BL and BL' while second ends of the second layers along the x direction are coupled to WL. The WL, for example, is disposed between the second layers of the selectors and isolated from the BL by the dielectric layer. The third layer of the first selector is disposed on the second layer of the first selector. Likewise, the third layer of the second selector is disposed on the second layer of the second selector. In one embodiment, the WL is formed of a conductive material, such as copper.

In forming a memory array, a plurality of unit cells are interconnected by BLs, BL's, WLs and RBLs, similar to that shown in FIGS. 3b-3d. The WLs and RBLs are disposed along the y direction while BLs and BL's are disposed along the x direction. In one embodiment, adjacent memory cells in the x direction share a common first layer of a selector. Other configurations of unit cells for a memory array may also be useful.

FIG. 5a shows a cross-sectional view of a 3×3 array 502a of stacked memory cells along the x-z direction, similar to the array 302 shown in FIGS. 3c-3d. The memory cells 400b of the array are similar to the unit cell 400b of FIG. 4b. Common elements may not be described or described in detail.

The memory cells are stacked between BL and BL' in a dielectric layer 590. As shown, the memory cells are stacked in three dielectric levels, $592_1$-$592_3$ of the dielectric layer. For illustration purposes, each dielectric level includes three memory cells along the x-direction. The array, for example, forms three columns and three rows of memory cells between BL and BL'. For example, each memory cell is associated with a wordline ($WL_{1-1}$, $WL_{1-2}$, $WL_{1-3}$, $WL_{2-1}$, $WL_{2-2}$, $WL_{2-3}$, $WL_{3-1}$, $WL_{3-2}$ or $WL_{3-3}$) and a read bitline RBL ($RBL_{1-1}$, $RBL_{1-2}$, $RBL_{1-3}$, $RBL_{2-1}$, $RBL_{2-2}$, $RBL_{2-3}$, $RBL_{3-1}$, $RBL_{3-2}$ or $RBL_{3-3}$). Memory cells in the vertical direction are divided in 3 sub-columns. Memory cells within a sub-column share common first layer 526 of the selectors. For example, first selectors of the first common sub-column share a common first layer and the second selectors of the first common sub-column share a common first layer. Also, memory cells of adjacent sub-columns share common first layers of the selectors. For example, second select units of the first sub-column and first select units of the second sub-column share a common first layer.

The first layer of first selectors are coupled to BL while the first layer of second selectors are coupled to BL'. As shown, BL and BL' include step portions. For BL, the step portion is an elevated step portion $532_B$ while the step portion of BL' is a lowered step portion $532_T$.

A plurality of arrays 502a may be interconnected by WLs and RBLs in the y direction to form a 3-D array, with each array forming a column of the 3-D array. Of course, it is understood that a column may include more than 3 memory cells.

FIG. 5b shows another embodiment of a cross-sectional view of a 3×3 array 502b of stacked memory cells along the x-z direction. The array is similar to array 302 and 502a of FIGS. 3c-3d and FIG. 5a respectively. The memory cells 400b of the array are similar to the unit cell 400b of FIG. 4b. Common elements may not be described or described in detail.

The memory cells are stacked between BL and BL' in a dielectric layer 590. As shown, the memory cells are stacked in three dielectric levels, $592_1$-$592_3$ of the dielectric layer. For illustration purposes, each dielectric level includes three memory cells along the x-direction. The array, for example, forms 3 columns and 3 rows of memory cells between BL and BL'. For example, each memory cell is associated with a wordline ($WL_{1-1}$, $WL_{1-2}$, $WL_{1-3}$, $WL_{2-1}$, $WL_{2-2}$, $WL_{2-3}$, $WL_{3-1}$, $WL_{3-2}$ or $WL_{3-3}$) and a read bitline RBL ($RBL_{1-1}$, $RBL_{1-2}$, $RBL_{1-3}$, $RBL_{2-1}$, $RBL_{2-2}$, $RBL_{2-3}$, $RBL_{3-1}$, $RBL_{3-2}$ or $RBL_{3-3}$). Memory cells in the vertical direction are divided in 3 sub-columns. Memory cells within a sub-column share common first layer 526 of the selectors. For example, first selectors of the first common sub-column share a common first layer and the second selectors of the first common sub-column share a common first layer. Also, memory cells of adjacent sub-columns share common first layers of the selectors. For example, second select units of the first sub-column and first select units of the second sub-column share a common first layer.

The first layer of first selectors are coupled to BL while the first layer of second selectors are coupled to BL'. As shown, BL' (the top bitline) includes a lowered step portion $532_T$ while BL (the bottom bitline) includes a planar top surface. As for the first layers which are coupled to BL, they extend to the top surface of BL. On the other hand, the first layers which are coupled to BL', they are isolated from BL by the dielectric layer.

A plurality of arrays 502b may be interconnected by WLs and RBLs in the y direction to form a 3-D array, with each array forming a column of the 3-D array. Of course, it is understood that a column may include more than 3 memory cells.

FIG. 5c shows yet another embodiment of a cross-sectional view of a 3×3 array 502c of stacked memory cells along the x-z direction. The array is similar to the array 302c and 502b of FIGS. 3c-3d and FIG. 5b. The memory cells 400b of the array are similar to the unit cell 400b of FIG. 4b. Common elements may not be described or described in detail.

The memory cells are stacked between BL and BL' in a dielectric layer 590. As shown, the memory cells are stacked in three dielectric levels, $592_1$-$592_3$ of the dielectric layer. For illustration purposes, each dielectric level includes three memory cells along the x-direction. The array, for example, forms 3 columns and 3 rows of memory cells between BL and BL'. For example, each memory cell is associated with a wordline ($WL_{1-1}$, $WL_{1-2}$, $WL_{1-3}$, $WL_{2-1}$, $WL_{2-2}$, $WL_{2-3}$, $WL_{3-1}$, $WL_{3-2}$ or $WL_{3-3}$) and a read bitline RBL ($RBL_{1-1}$, $RBL_{1-2}$, $RBL_{1-3}$, $RBL_{2-1}$, $RBL_{2-2}$, $RBL_{2-3}$, $RBL_{3-1}$, $RBL_{3-2}$ or $RBL_{3-3}$). Memory cells in the vertical direction are divided in 3 sub-columns. Memory cells within a sub-column share common first layer 526 of the selectors. For example, first selectors of the first common sub-column share a common first layer and the second selectors of the first common sub-column share a common first layer. Also, memory cells of adjacent sub-columns share common first layers of the selectors. For example, second select units of the first sub-column and first select units of the second sub-column share a common first layer.

The first layer of first selectors are coupled to BL while the first layer of second selectors are coupled to BL'. As shown, BL' (the top bitline) includes a lowered step portion $532_T$ while BL (the bottom bitline) includes a planar top surface.

Doped bases 536 are disposed on BL to provide connections to the first layers of selectors which are coupled to BL. The doped bases, for example, are heavily doped silicon bases, such as polysilicon bases. The bases are heavily doped with first polarity type dopants. For first layers which are coupled to BL', no doped bases are provided, leaving the dielectric layer to isolate them from BL.

A plurality of arrays 502c may be interconnected by WLs and RBLs in the y direction to form a 3-D array, with each array forming a column of the 3-D array. Of course, it is understood that a column may include more than 3 memory cells.

FIGS. 6a-6h show cross-sectional views of a process of forming an embodiment of a device 600. The process includes forming a memory cell. The memory cell, for example, may be a NVM memory cell. The memory cell, in one embodiment, is DW magnetic NVM cell. The memory cell, for example, is similar to that described in FIGS. $4a_1$-$4a_2$. Common elements may not be described or described in detail.

The cross-sectional views, for example, are along the y or wordline direction. The cross-sectional view is taken along A-A" as shown in FIG. $4a_1$. Furthermore, although the cross-sectional view shows one memory cell, it is understood that the device includes a plurality of memory cells of, for example, a memory array. The process of forming the memory cell may be compatible with a CMOS logic process. For example, the memory cell can be formed simultaneously with CMOS logic devices (not shown) on the same substrate.

Figure 6A:
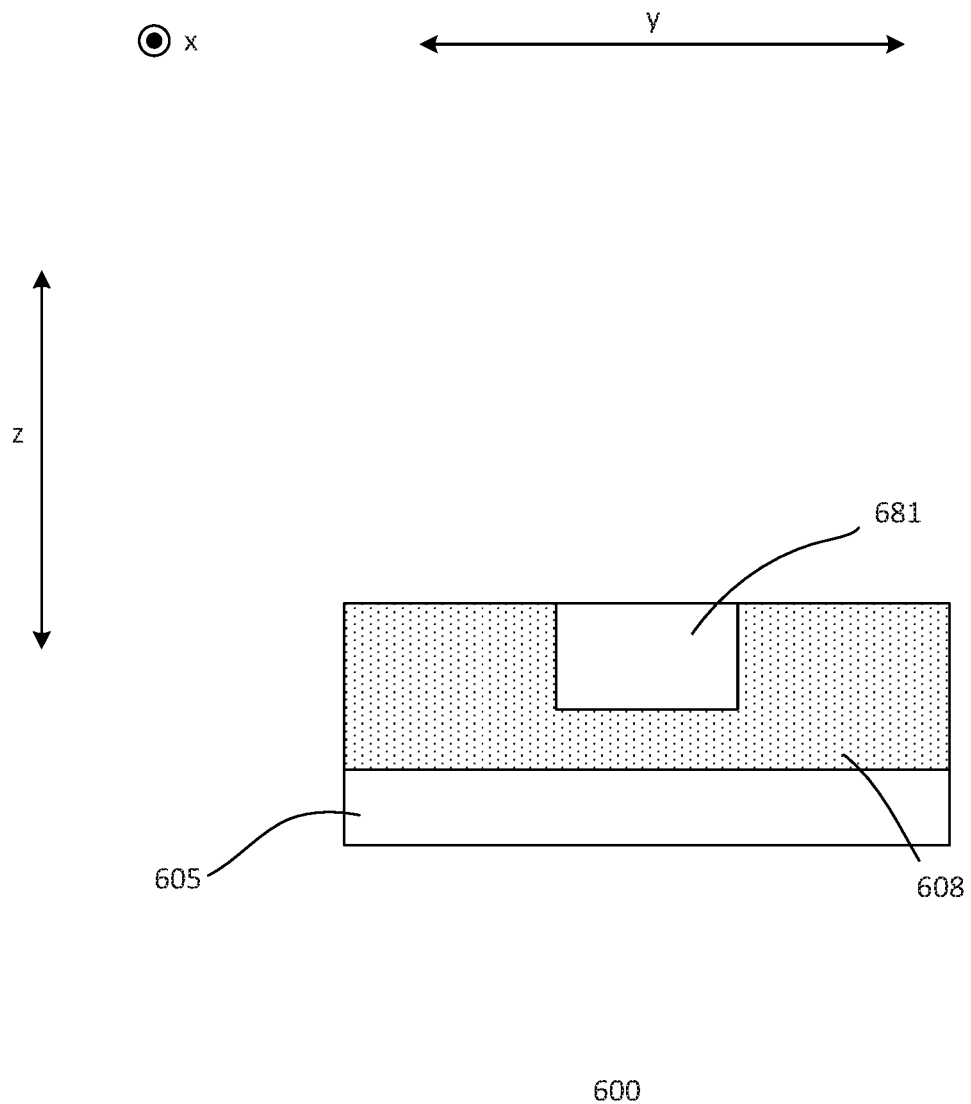

Referring to FIG. 6a, a substrate 605 is provided. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate for example, is a silicon-on-insulator (SOI) substrate. For example, the surface and bulk crystalline layers are single crystalline silicon. Other types of COI substrates may also be useful. It is understood that the surface and bulk layers need not be formed of the same material.

The substrate is processed to define a cell region in which a memory cell is formed. The cell region may be part of an array region. For example, the array region may include a plurality of cell regions. The substrate may include other types of device regions, such as a logic region. Other types of regions may also be provided.

Isolation regions are formed in the substrate. In one embodiment, the isolation regions are shallow trench isolation (STI) region. Other types of isolation regions may also be useful. The isolation regions are provided to isolate device regions from other regions. For example, the isolation regions may isolate cells in the bitline and wordline directions. In one embodiment, the cell region may also include an isolation region 681. The isolation region in the cell region serves to separate the cell region into first and second portions. Isolation regions may be formed by, for example, etching trenches in the substrate and filling them with a dielectric material, such as silicon oxide. A planarization process, such as chemical mechanical polish (CMP), is performed to remove excess dielectric material, leaving, for example, STI regions isolating device regions. The different isolation regions may be formed in the same process.

Doped wells are formed after forming the isolation regions. The wells, for example, may serve various purposes. In one embodiment, a cell well or device well 608 is formed. The cell well, for example, serves as a well for isolating bitlines of the memory cell. The cell well is a second polarity type cell well. The cell well may also be a common array well. Forming the cell or array well may be achieved by implanting second polarity type dopants into the substrate. In one embodiment, an implant mask may be employed to implant the dopants to form the doped wells. The implant mask, for example, is a patterned photoresist layer. The implant mask exposes regions of the substrate in which the second polarity type cell wells are formed. The device well may be lightly or intermediately doped with second polarity type dopants. For example, the device well may have a dopant concentration of about $1E16$-$1E19/cm^3$. Other suitable dopant concentrations may also be useful. The different wells may be formed by different implants and implant masks.

Figure 6B:
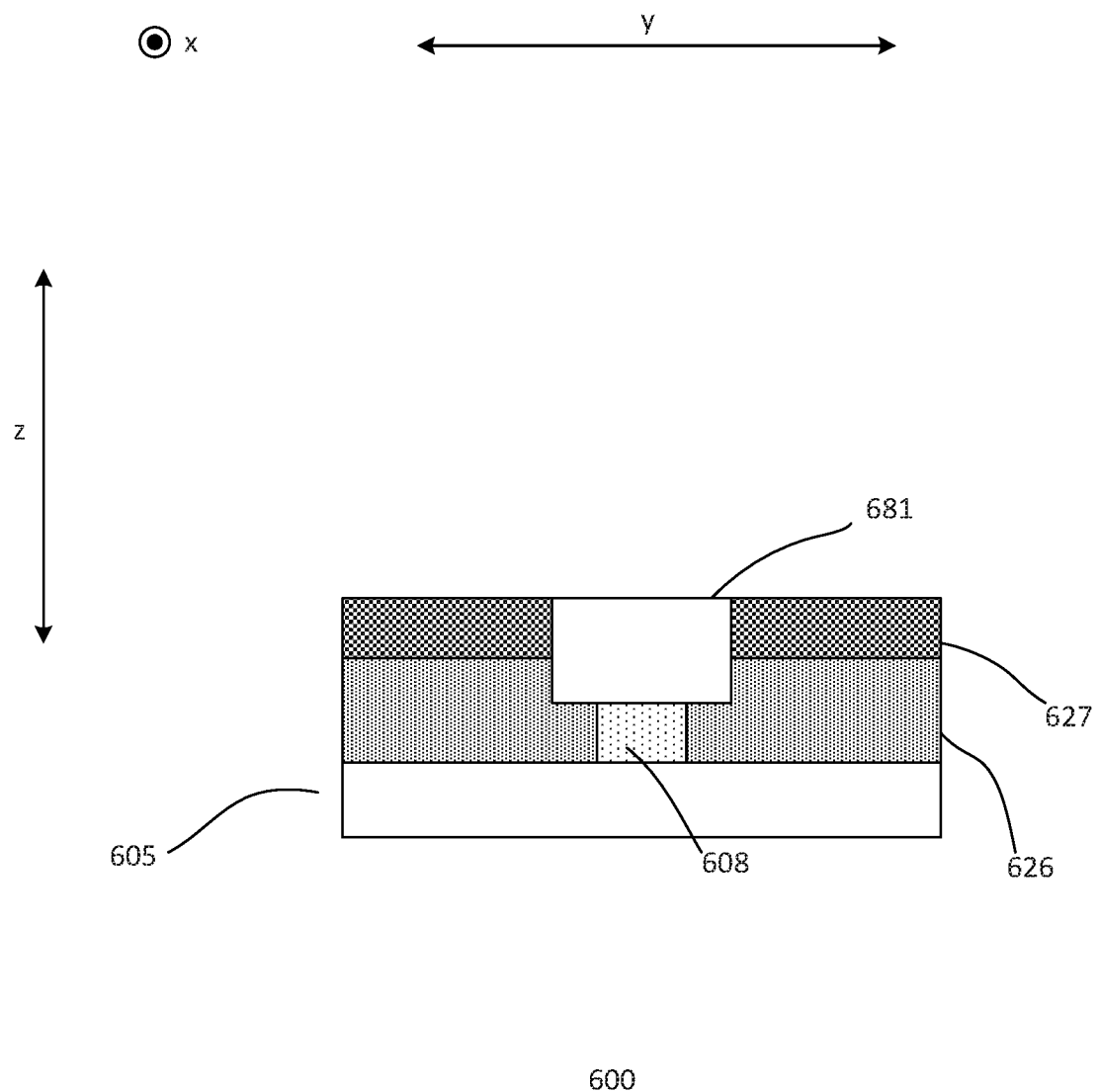

As shown in FIG. 6b, first and second doped layers 626 and 627 of the BJTs are formed in the cell region. The first doped layer is a heavily doped first polarity type doped layer while the second doped layer is a heavily doped second polarity type doped layer. For example, the first and second doped layers may have a dopant concentration of about $1E17$-$1E20/cm^3$. The first and second doped layers are formed using different implant processes. The different implant processes may employ the same or different implant mask.

In one embodiment, the first polarity type dopant implant forms the first doped layers 626 having a depth greater than the isolation region 681. The first doped layer serves as a first terminal of the first and second select transistors of the select unit. For example, the first doped layer serves as a terminal of the select unit or BL and BL'. The terminals are isolated from each other by the cell or array well. A second polarity type implant forms the second doped layer 627 which has a depth shallower than the isolation region 681. The second doped layer forms a common wordline terminal of transistors of the select unit.

Figure 6C:
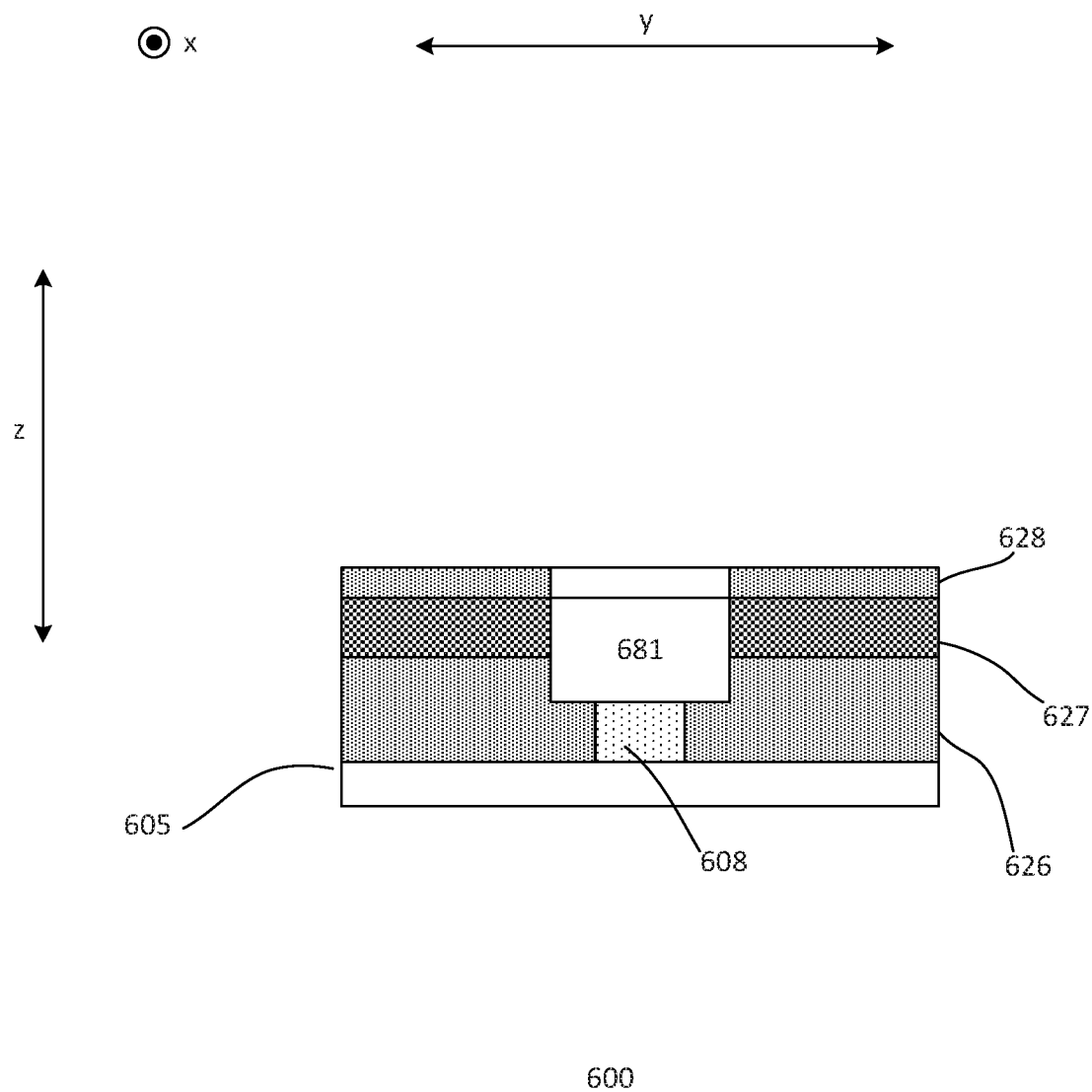

In FIG. 6c, a third doped layer 628 of the transistors of the select unit is formed. In one embodiment, the third doped layer is an epitaxial layer. For example, the third doped layer is an epitaxial silicon layer. The third doped layer is formed by selective epitaxial growth. The selective epitaxial growth may employ a mask, such as a silicon oxide mask. The mask may be formed on the substrate and patterned to expose the substrate where the epitaxial layers are formed. The third layer is heavily doped with first polarity type dopants, similar to the first doped layer. Doping the third layer may be achieved by ion implantation or in-situ doping. The first, second and third doped layers form select transistors of the select unit. The third doped layer, for example, may be formed as part of the S/D implant or epitaxially grown S/D regions of a transistor in other device region of the same substrate.

The process may also include forming other transistors for the logic region, such as metal oxide transistors. Such process may include forming gate layers on the substrate and patterning the gate layers to form gates. After forming the gates, source/drain regions as well as other contact regions may be formed. Other techniques for integrating logic transistors with the select unit may also be useful.

Figure 6D:
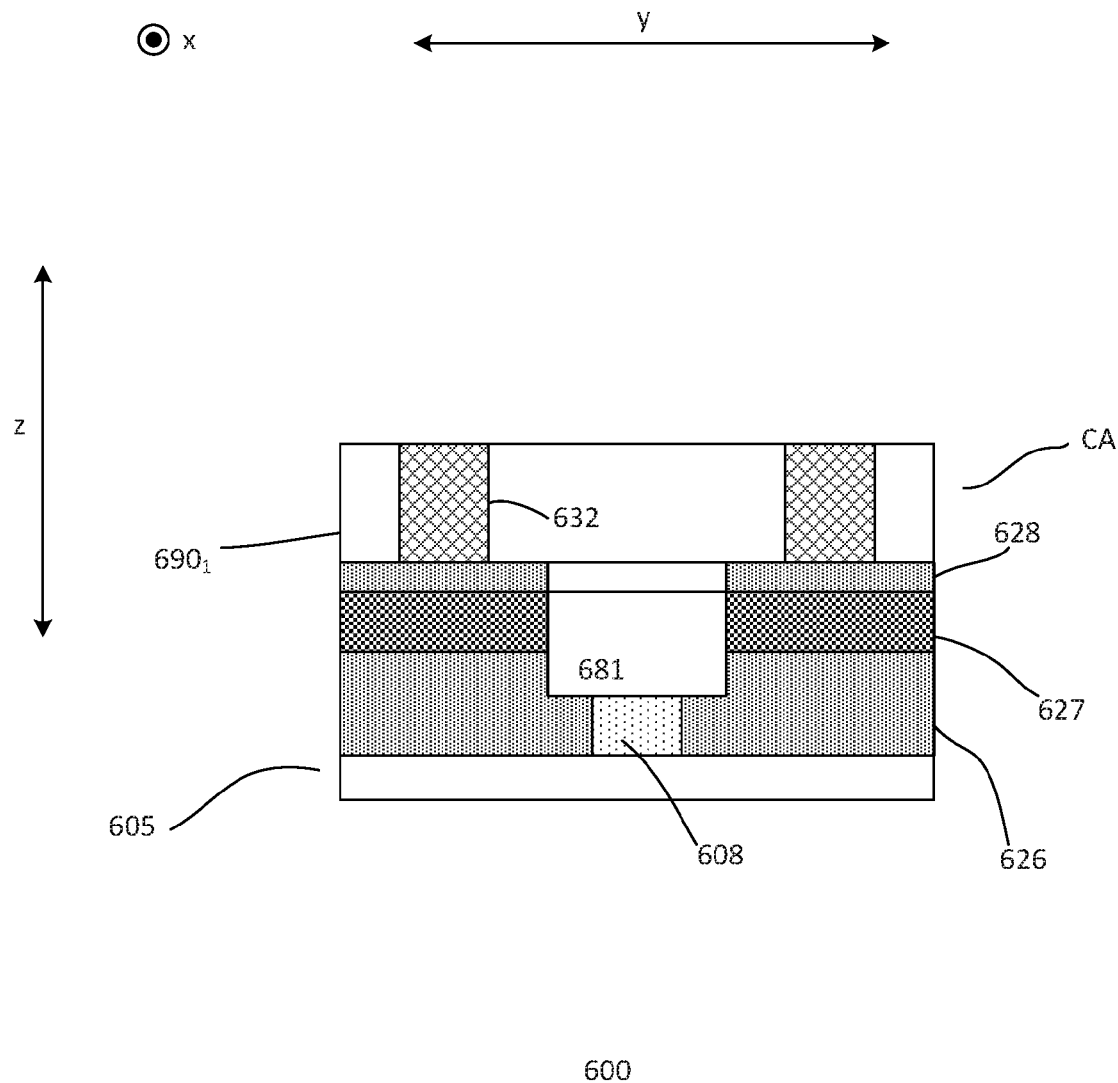

Referring to FIG. 6d, a dielectric layer $690_1$ is formed on the substrate, covering the substrate. The dielectric layer, for example, serves as a dielectric layer of an ILD layer. For example, the dielectric layer serves as a pre-metal dielectric (PMD) or CA level of an ILD layer. The dielectric layer, for example, is a silicon oxide layer. Other types of dielectric layers may also be useful. The dielectric layer may be formed by chemical vapor deposition (CVD). Other techniques for forming the dielectric layer may also be useful. A planarizing process may be performed to produce a planar surface. The planarizing process, for example, may include CMP. Other types of planarizing processes may also be useful.

In one embodiment, contacts 632 are formed in the dielectric layer. The contacts, for example, connect to contact regions on the substrate. For example, the contacts connect to the third doped layer of the transistors of the select unit. Contacts may also be provided for other contact regions of the substrate, such as source/drain regions of logic transistors as well as other contact regions, such as well bias contacts. To form contacts, contact vias are formed in the dielectric layer. Forming the contact vias may be achieved using mask and etch techniques, as previously described. After the vias are formed, a conductive material is deposited to fill the vias. The conductive material, for example, may be tungsten. Other types of conductive materials may also be useful. A planarization process, such as CMP, is performed to remove excess conductive material, leaving contact plugs in the contact vias.

Figure 6E:
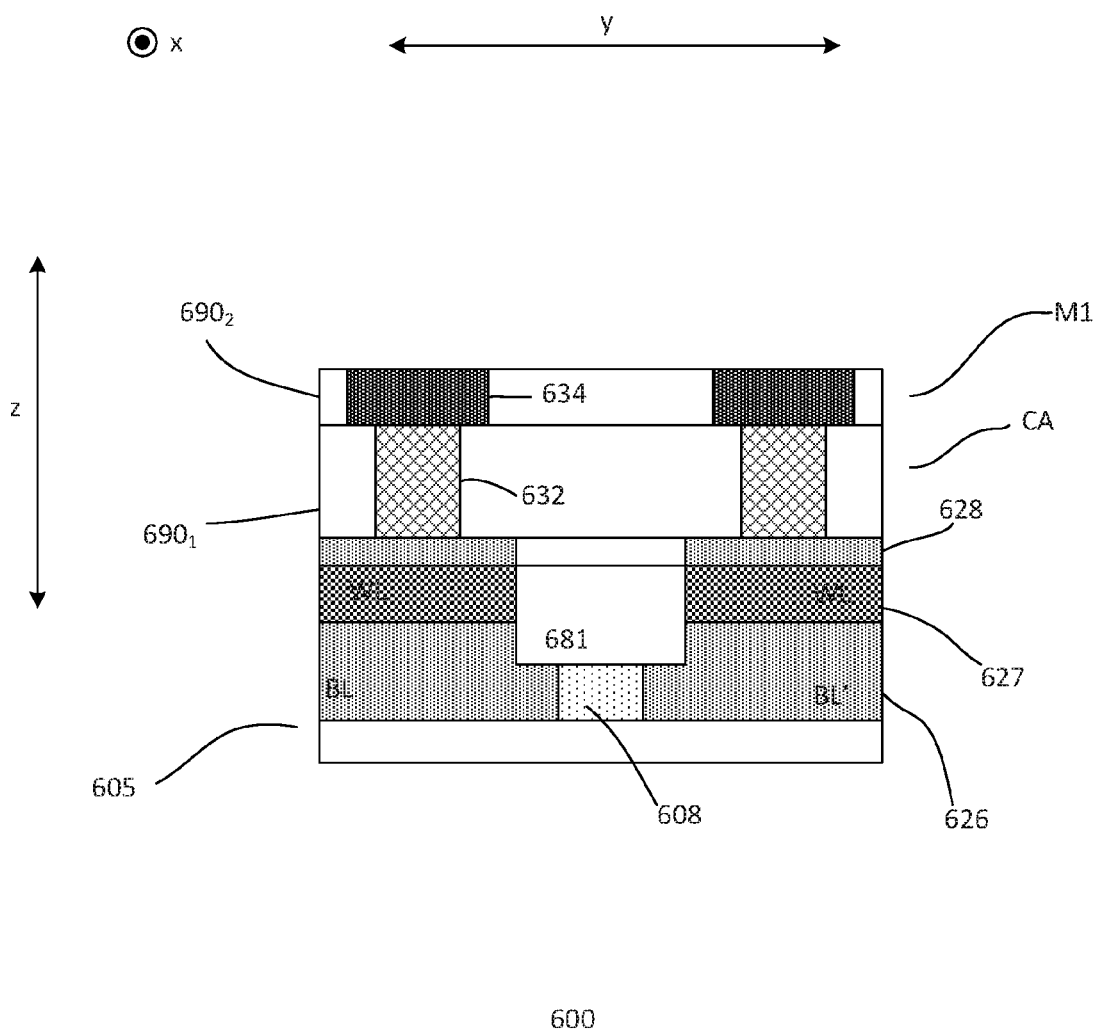

In FIG. 6e, a dielectric layer $690_2$ is formed over the substrate, covering the underlying dielectric layer $690_1$. The dielectric layer, for example, serves as a metal level of an ILD layer. In one embodiment, the dielectric layer serves as M1 level of the ILD layer. Providing a dielectric layer of other levels may also be useful. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Conductive lines are formed in the dielectric layer. In one embodiment, conductive pads 634 are formed. The conductive pads serve to provide a connection to the third terminals of the select transistors. The conductive pads and lines may be formed by damascene techniques. For example, the upper dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other suitable types of conductive layers or forming techniques may also be useful.

Figure 6F:
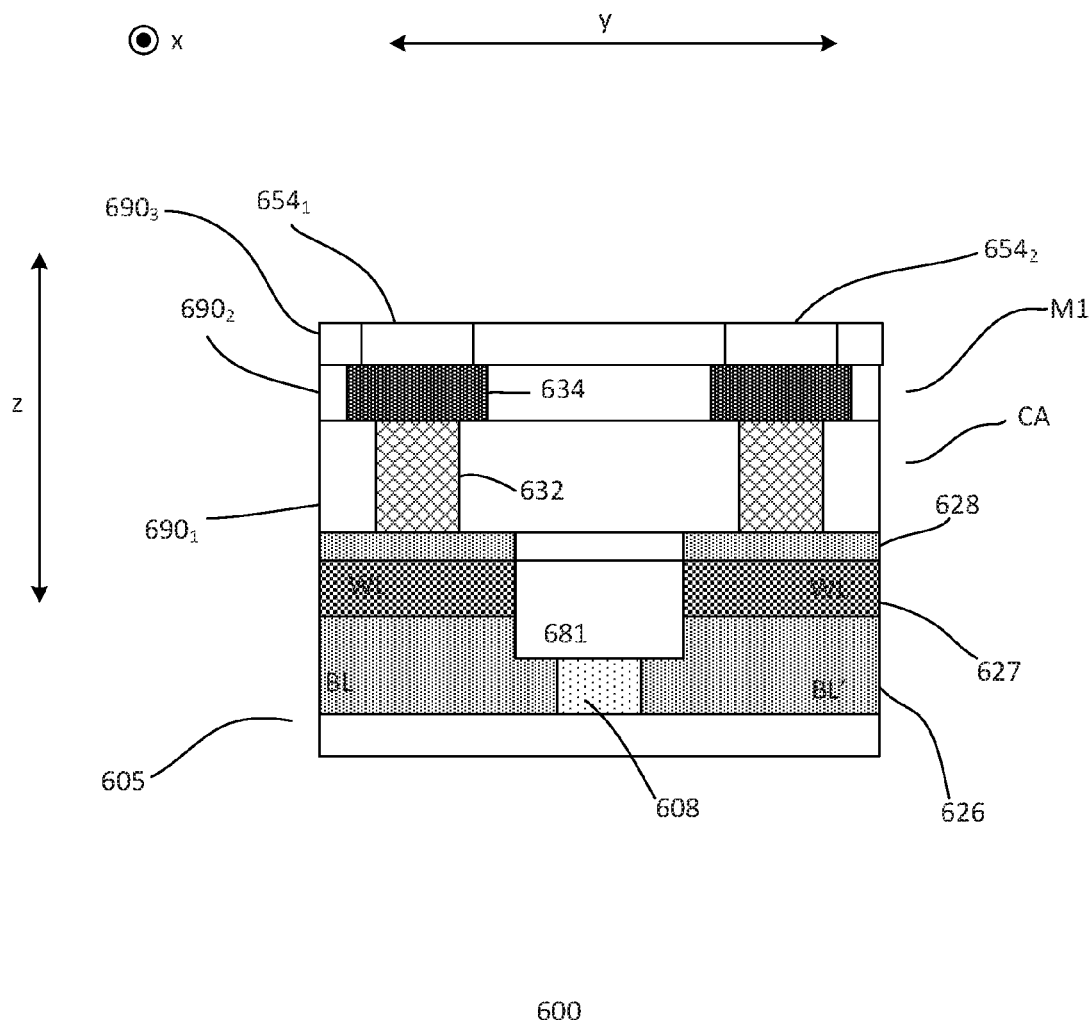

As shown in FIG. 6f, the process forms pinning layers of the storage unit of the memory cell. For example, a pinning layer is formed on the substrate over the dielectric layer $690_2$. In one embodiment, the pinning layer includes Co/Pt multilayer or laminated based film stack. Other suitable types of pinning layers may also be useful. The pinning layer may be formed by electroless deposition, CVD or atomic layer deposition (ALD). Other suitable techniques for forming the pinning layer may also be useful.

The pinning layer is patterned to form pinning layers $654_1$-$654_2$ of the storage unit which are electrically coupled to the contact pads 634. Patterning the pinning layer may be achieved using mask and etch techniques. For example, an anisotropic etch, such as a RIE, patterns the pinning layer using a patterned mask, such as a patterned photoresist mask. Other techniques for forming the pinning layers of the storage unit may also be useful. After patterning the pinning layers, a dielectric layer $690_3$ is formed on the substrate. The dielectric layer may be planarized by, for example, CMP, removing excess dielectric material and providing a planar surface with exposed pinning layers. Other techniques for forming the pinning layers may also be useful.

Figure 6G:
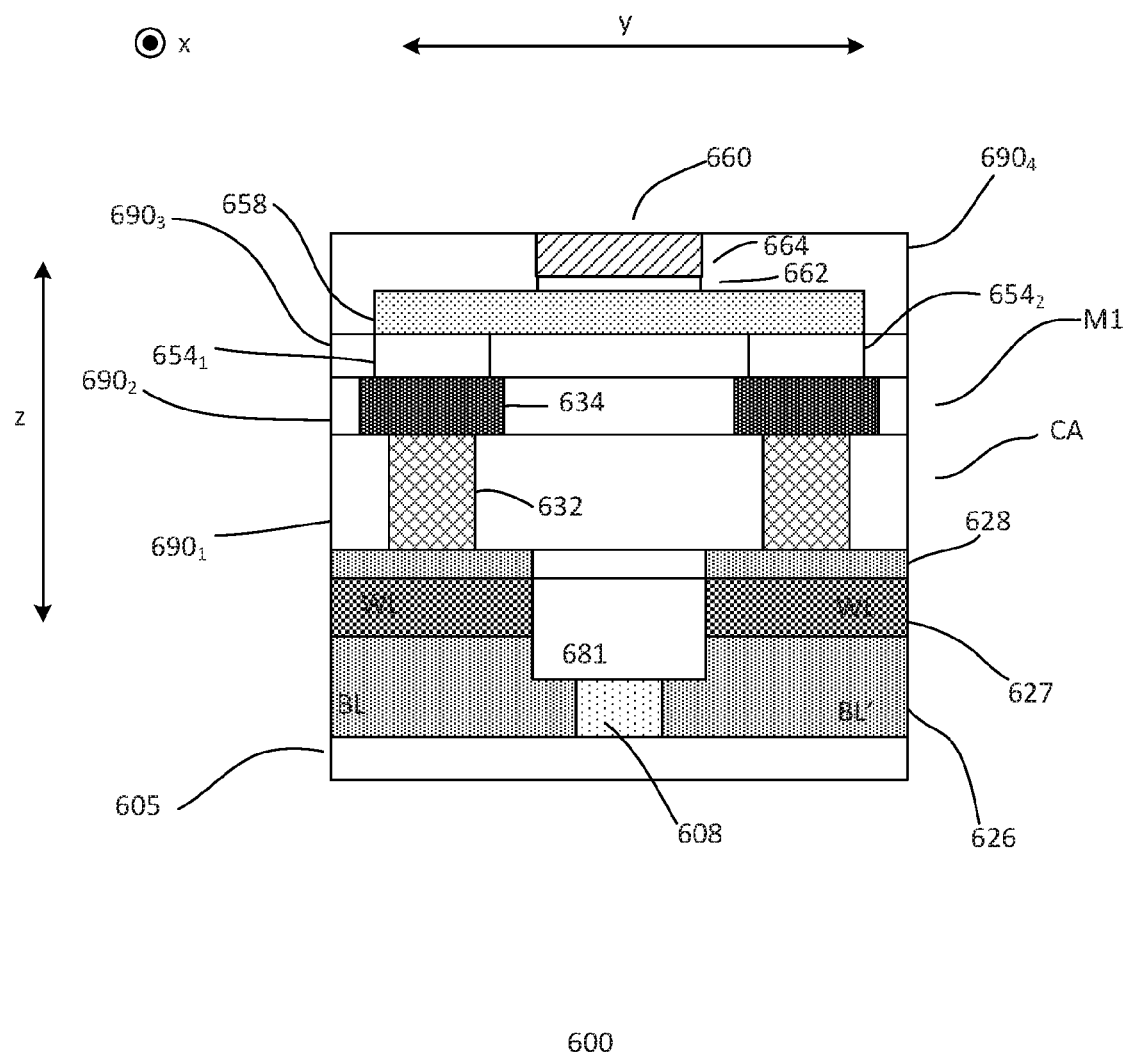

Referring to FIG. 6g, the process continues to form a patterned free layer 658 on the pinning layers $654_1$-$654_2$. A blanket free layer is formed on the substrate over the pinning layers. The blanket free layer may be, for example, a CoFeB layer or multilayer film stack formed by electroless deposition or sputtering. Other suitable types of free layers or forming processes may also be useful. The blanket free layer is patterned using mask and etch techniques. A dielectric layer, such as silicon oxide, may be formed over the patterned free layer and planarized to form a planar surface with the patterned free layer.

A reference layer 660 is formed on the free layer. The reference layer has a fixed magnetization in the first magnetization direction. The first magnetization is in the vertical or z direction, such as +z (upwards) or −z (downwards) direction. In one embodiment, the reference layer is a reference stack with multiple layers. For example, the reference stack includes a magnetic reference layer 664 formed over a tunneling barrier layer 662. The magnetic reference layer may be Co/Pt multilayer or laminated based film stack and the tunneling barrier layer may be a MgO layer. Other suitable types of magnetic reference and tunneling barrier layers may also be useful.

Forming the reference layer may include forming the various layers of the reference stack on the substrate over the free layer. The layers may be formed by, for example, electroless deposition, sputtering or ALD. Other suitable forming techniques may also be useful. The various layers are patterned using etch and mask techniques to form the reference stack. For example, the layers of the reference stack may be patterned by an anisotropic etch, such as a RIE, using an etch mask, such as a patterned photoresist layer. The etch may pattern the whole reference stack 660 including magnetic reference layer 664 and tunneling barrier layer 662. Alternatively, the etch may stop at the magnetic reference layer 664. For example, the tunneling barrier remains unpatterned.

The various layers may be formed using other techniques. For example, the tunneling barrier layer may be formed along with the reference layer and both layers may be patterned together. In other instances, the free layer and tunneling barrier may be patterned together followed by forming and patterning the reference layer. In yet other instances, the free layer, tunneling barrier layer and reference layer may be formed separately and separate mask and etch processes are performed for each layer. For example, a first mask and etch process may be employed to pattern the free layer and tunneling barrier layer while a second mask and etch process may be employed to pattern the reference layer. Other configurations of forming the storage unit may also be useful.

A dielectric layer $690_4$ is formed over the substrate covering the reference stack. Excess dielectric material is removed by planarization, such as CMP, forming a planar surface and exposing the reference layer.

Figure 6H:
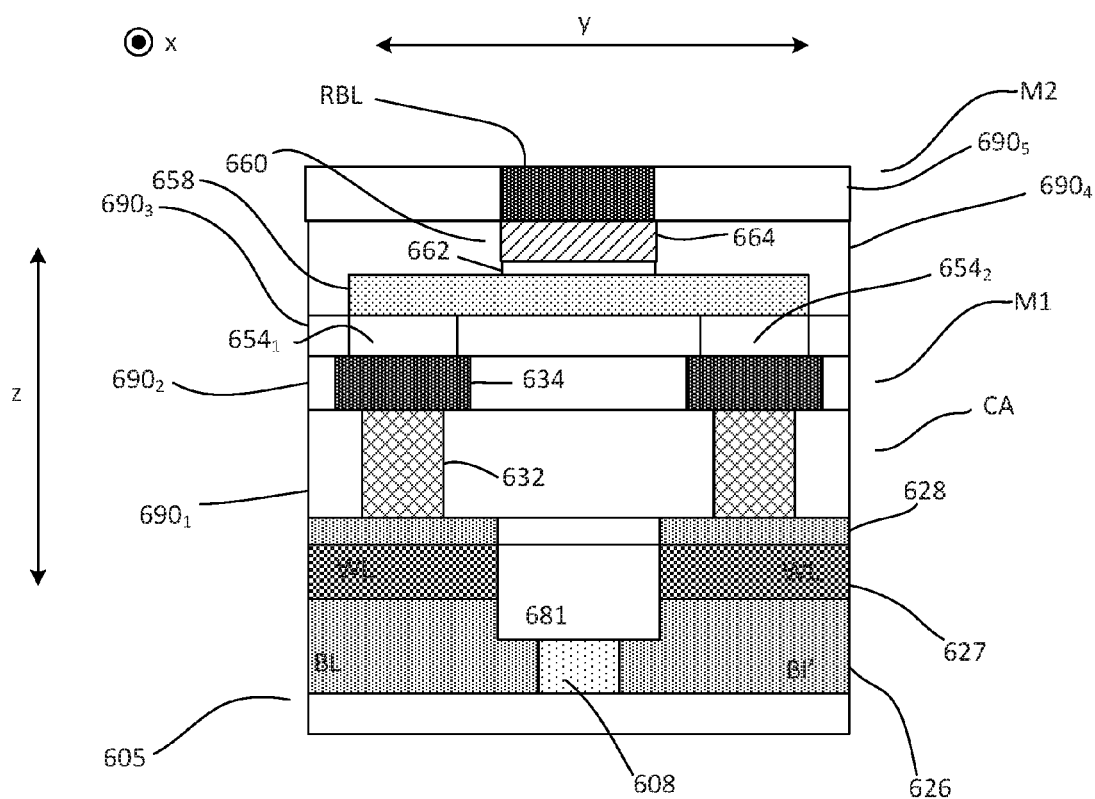

In one embodiment, as shown in FIG. 6h, a RBL is formed over the reference stack. The RBL is disposed on the reference stack. The RBL may be formed of a conductive material, such as copper or a copper alloy. The RBL may be formed in a dielectric layer $690_5$ of a metal level, such as M2. The RBL may be formed using a damascene process. For example, a trench is formed in a dielectric layer and filled with the conductive material. A CMP is performed to remove excess conductive material, forming the RBL. Formation of a RBL may be integrated into a dual damascene process which is used to form metal lines and via contacts for M2 and V1. For example, dielectric layers $690_3$-$690_4$ are dielectric layers of V1. As discussed, RBL extends the length of a column of memory cells in the x direction. Other techniques for forming RBL, such as RIE, may also be useful.

As discussed, a plurality of memory cells may be formed and interconnected to form a memory array. For example, memory cells are coupled in the x direction by BLs, BL's and RBLs and in the y direction by WLs. Metal BLs and BL's may be formed in a metal level and stitched down to the substrate, for coupling the doped BLs and BLs. The metal BLs and BL's may be formed in the same metal level as the RBLs or on different metal levels.

FIGS. 7a-7k show cross-sectional views of a process of forming an embodiment of a device 700. The process includes forming memory cells. The memory cells, for example, may be a NVM memory cells. The memory cells, in one embodiment, are DW magnetic NVM cells. The memory cells, for example, are similar to that described in FIGS. $4b_1$-$4b_2$. The cross-sectional views, for example, are along the x or bitline direction. The process illustrates forming a 3×3 memory array in the x-z direction, as shown in FIG. 5a. Common elements may not be described or described in detail. It is understood that forming other size arrays may also be useful. The process of forming the memory cells may be compatible with a CMOS logic process. For example, the memory cell can be formed simultaneously with CMOS logic devices (not shown) on the same substrate.

Referring to FIG. 7a, a substrate 705 is provided. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

The substrate may include various types of regions. For example, the substrate may include an array region in which memory cells are formed and logic region in which logic transistors are formed. The logic region may include various types of logic regions, such as high voltage (HV), intermediate voltage (IV) and low voltage (LV) regions. Providing a substrate with other regions may also be useful.

In one embodiment, front-end-of-line (FEOL) processing has been performed on the substrate. For example, isolation regions, wells, circuit components, such as transistors, have been formed (all not shown). After FEOL, back-end-of-line (BEOL) processing commences. For example, a dielectric layer 770 is formed on the substrate. The dielectric layer, for example, serves as a dielectric layer of an ILD layer. For example, the dielectric layer serves as a PMD or CA level of an ILD layer. The dielectric layer, for example, is a silicon oxide layer. Other types of dielectric layers may also be useful. The dielectric layer may be formed by CVD. Other techniques for forming the dielectric layer may also be useful. A planarizing process may be performed to produce a planar surface. The planarizing process, for example, may include CMP. Other types of planarizing processes may also be useful.

Contacts (not shown) may be formed in the dielectric layer. The contacts, for example, connect to contact regions on the substrate. For example, the contacts connect contact regions of transistors in logic regions. To form contacts, contact vias are formed in the dielectric layer. Forming the contact vias may be achieved using mask and etch techniques, as previously described. After the vias are formed, a conductive material is deposited to fill the vias. The conductive material, for example, may be tungsten. Other types of conductive materials may also be useful. A planarization process, such as CMP, is performed to remove excess conductive material, leaving contact plugs in the contact vias.

Figure 7B:
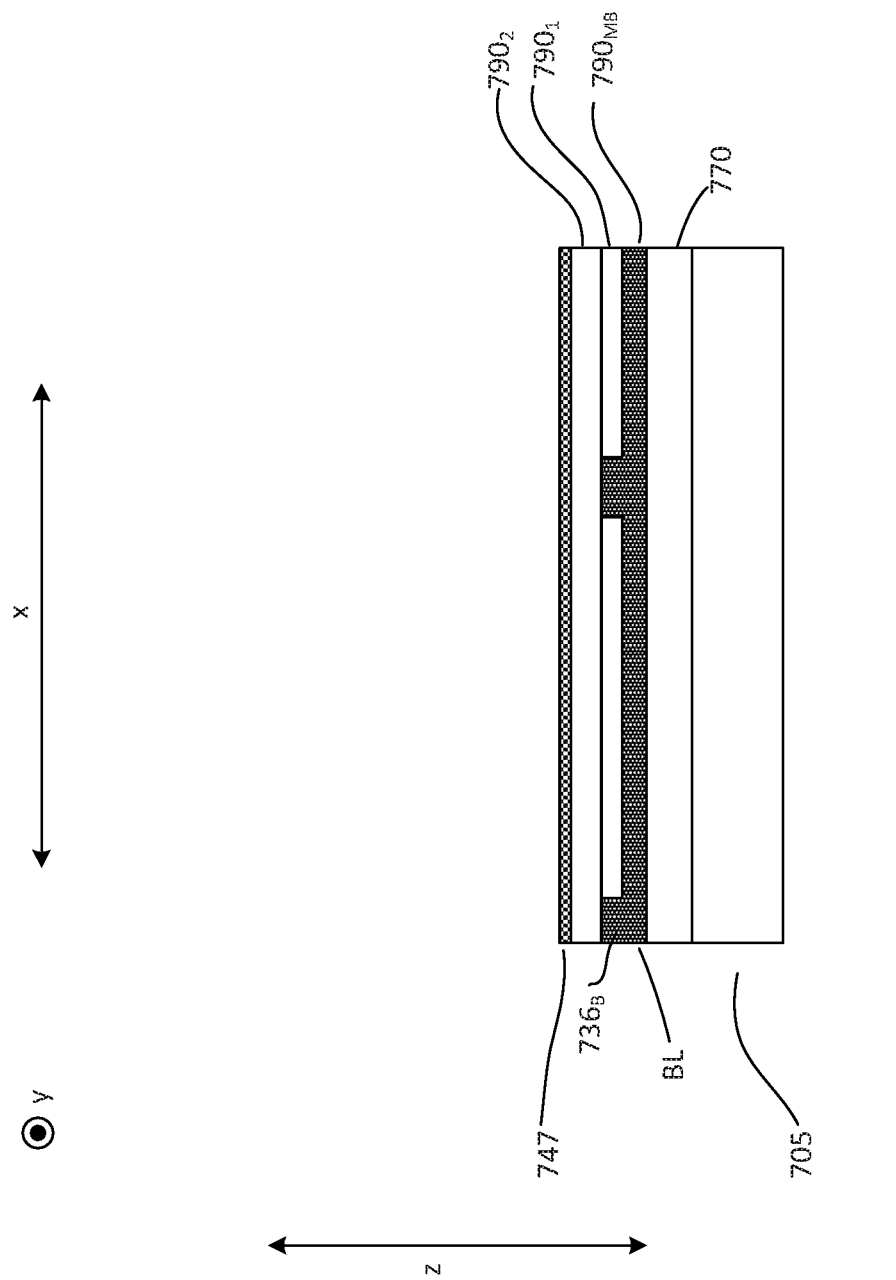

In FIG. 7b, a dielectric layer $790_{MB}$ is formed over the substrate, covering the underlying dielectric layer. The dielectric layer $790_{MB}$, for example, serves as a metal level of an ILD layer. In one embodiment, the dielectric layer serves as M1 level of the ILD layer. Providing a dielectric layer of other levels may also be useful. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Conductive lines are formed in the dielectric layer. In one embodiment, bottom bitlines are formed in dielectric layer. The bottom bitlines are formed in a region corresponding to the array region. The bottom bitlines serves as a first bitline of a memory array. For example, the bottom bitlines serve as BLs. Providing the bottom bitlines as BL's may also be useful. The bottom bitlines form columns of memory cells along the x direction.

The bitline may be formed by damascene technique. For example, the dielectric layer may be etched to form trenches or openings using, for example, mask and etch techniques.

A conductive layer is formed on the substrate, filling the openings. For example, a copper or copper alloy layer may be formed to fill the openings. The conductive material may be formed by, for example, plating, such as electro or electroless plating. Other suitable types of conductive layers or forming techniques may also be useful.

In one embodiment, a first cell dielectric layer $790_1$ is formed on the substrate over the bottom BL. The dielectric layer may be silicon oxide formed by CVD. Other types of dielectric layers or forming techniques may also be useful. Bottom conductive steps $736_B$ are formed. The bottom conductive steps, for example, are conductive pads disposed over the bottom BL to facilitate coupling to a first selector of the select unit. The bottom conductive steps may be metal steps, such as copper or copper alloy. Other types of conductive materials may also be useful. The bottom conductive steps may be formed using a damascene technique. Alternatively, RIE may be employed to form the bottom conductive steps followed by forming the dielectric layer $790_1$ and CMP.

After forming the bottom conductive steps, a second cell dielectric layer $790_2$ is formed over the substrate. The second cell dielectric layer may be silicon oxide formed by CVD. Other types of dielectric layers or forming techniques may also be useful. The second cell dielectric layer provides isolation of the memory cells from the bottom bitlines.

A doped layer 747 is formed over the second cell dielectric layer. The doped layer is a heavily doped layer with second polarity type dopants. The doped layer may be, for example, a heavily doped silicon layer with second polarity type dopants. The silicon layer, for example, may be polysilicon. Other types of silicon or semiconductor layers may also be useful. The doped layer may be formed by, for example, CVD. Doping the layer may be achieved using ion implantation or in-situ doping. The second polarity type doped layer may serve as second or base terminals of BJT selectors of the memory cells.

The doped layer is patterned to form columns of doped layers corresponding to bottom bitlines in the array region. Patterning of the doped layer may be achieved with mask and etch techniques. For example, a RIE is performed using an etch mask, such as a patterned photoresist layer to form the columns of doped layers along the y direction. After patterning the doped layer, a dielectric layer, such as silicon oxide, may be formed on the substrate by CVD. The dielectric layer is planarized by, for example, CMP to expose the patterned doped layers separated by the dielectric layer.

Referring to FIG. 7c, the process forms wordlines WL of the memory cells. The wordlines, for example, are metal wordlines, such as copper or copper alloy. Other conductive materials may also be useful. The wordlines, for example, may be formed on a metal level of the device, such as M2.

The wordlines may be formed using a damascene process. For example, a trench is formed in a dielectric layer and filled with the conductive material. A CMP is performed to remove excess conductive material, forming the wordlines. Forming the wordlines may be integrated into a dual damascene process used to form metal lines and via contacts for M2 and V1. For example, dielectric layers $790_1$-$790_2$ are dielectric layers of V1. As discussed, wordlines extend the length of a row of memory cells in the y direction. Other techniques for forming the wordlines may also be useful, such as RIE.

Figure 7D:
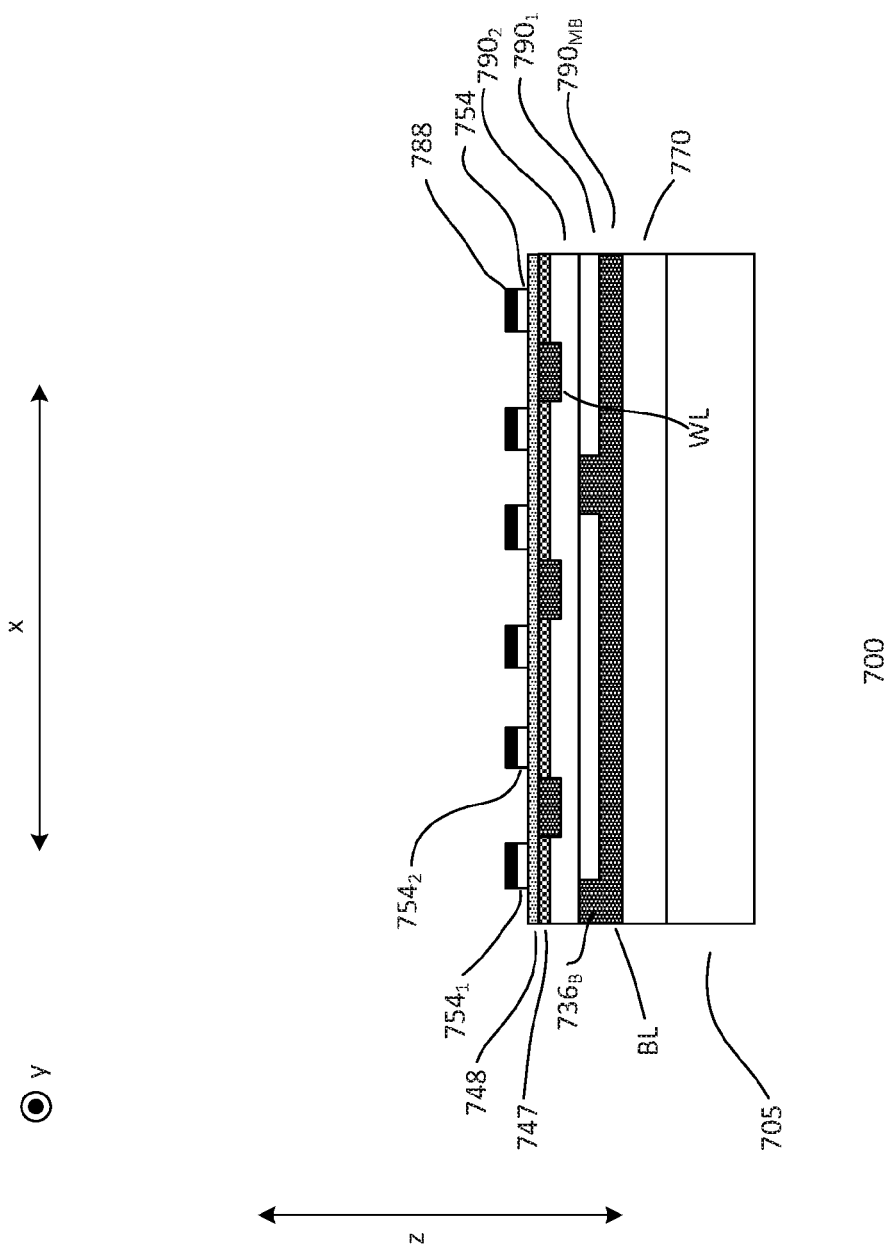

In FIG. 7d, a doped layer 748 is formed over the substrate. The doped layer is a heavily doped layer with first polarity type dopants. The doped layer may be, for example, a heavily doped silicon layer with first polarity type dopants. The silicon layer, for example, may be polysilicon. Other types of silicon or semiconductor layers may also be useful. The doped layer may be formed by, for example, CVD. Doping the layer may be achieved using ion implantation or in-situ doping. The first polarity type doped layer may serve as first (emitter or collector) terminals of BJT selectors of the memory cells. The first polarity type doped layer contacts the second polarity type doped layer.

A pinning layer 754 is formed on the substrate. The pinning layer is disposed on the first polarity type doped layer. The pinning layer, on one embodiment, is a Co/Pt multilayer or laminated based film stack. Other suitable types of pinning layers may also be useful. The pinning layer may be formed by electroless deposition, CVD or ALD. Other suitable techniques for forming the pinning layer may also be useful. The pinning layer is patterned to form pinning layers $754_1$-$754_2$ of the storage unit. Patterning the pinning layer may be achieved using mask and etch techniques. For example, an anisotropic etch, such as a RIE, patterns the pinning layer using a patterned mask 788, such as a patterned photoresist mask.

Referring to FIG. 7e, the process continues to pattern the first polarity type doped layer 748. In one embodiment, patterning the first polarity type doped layer employs the mask used to pattern the pinning layer. For example, an RIE etches the first polarity type doped layer using mask 788. The etch is selective to the second polarity type doped layer. For example, the etch stops when it reaches top surface of the second polarity type doped layer, leaving the second polarity type doped layer remaining.

Figure 7F:
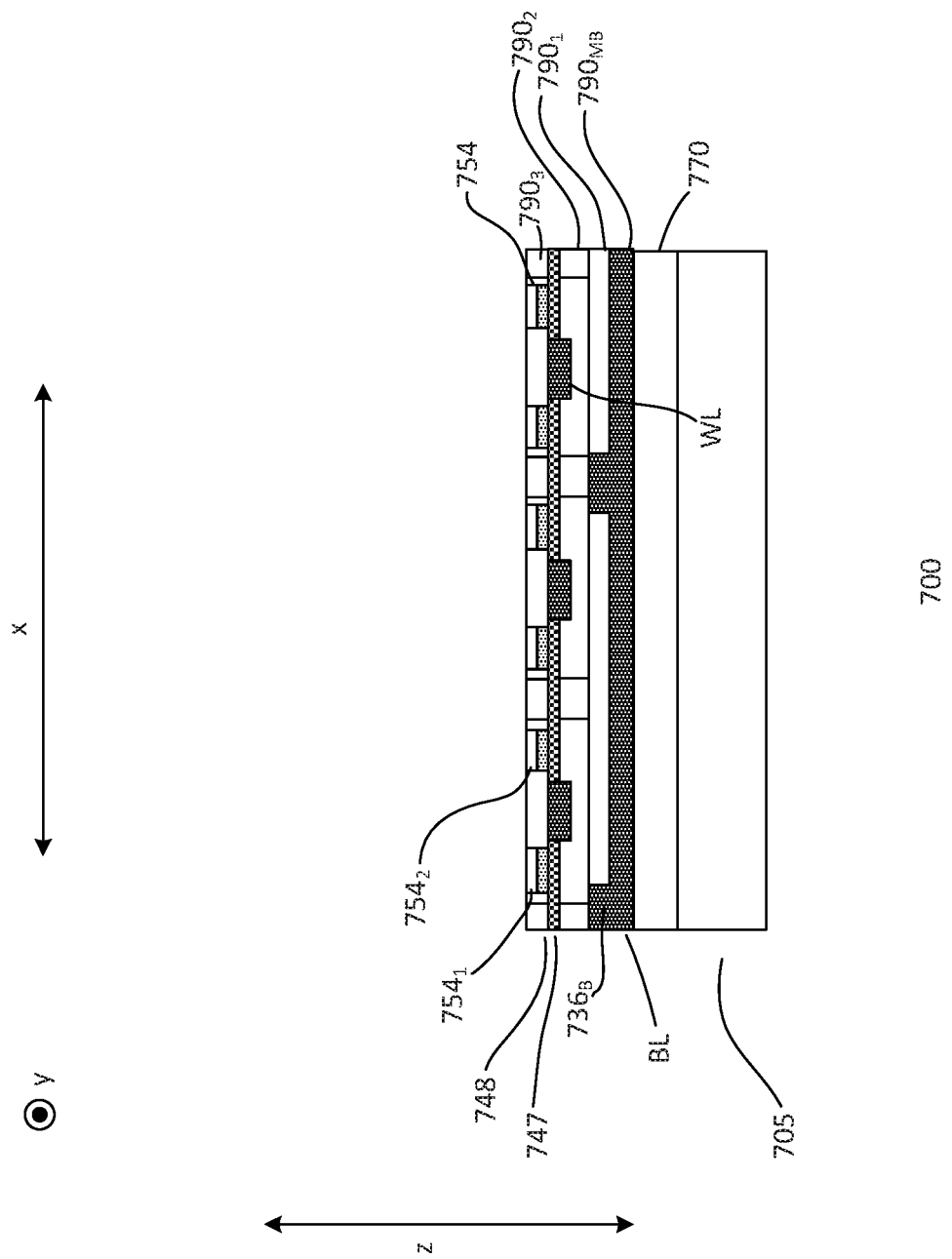

As shown in FIG. 7f, a dielectric layer $790_3$ is formed on the substrate. The dielectric layer covers the substrate and fills the gaps between the patterned first polarity typed doped and pinning layers. A planarization process, such as CMP, is performed to provide a planar top surface and exposing the pinning layers or the storage units.

Figure 7G:
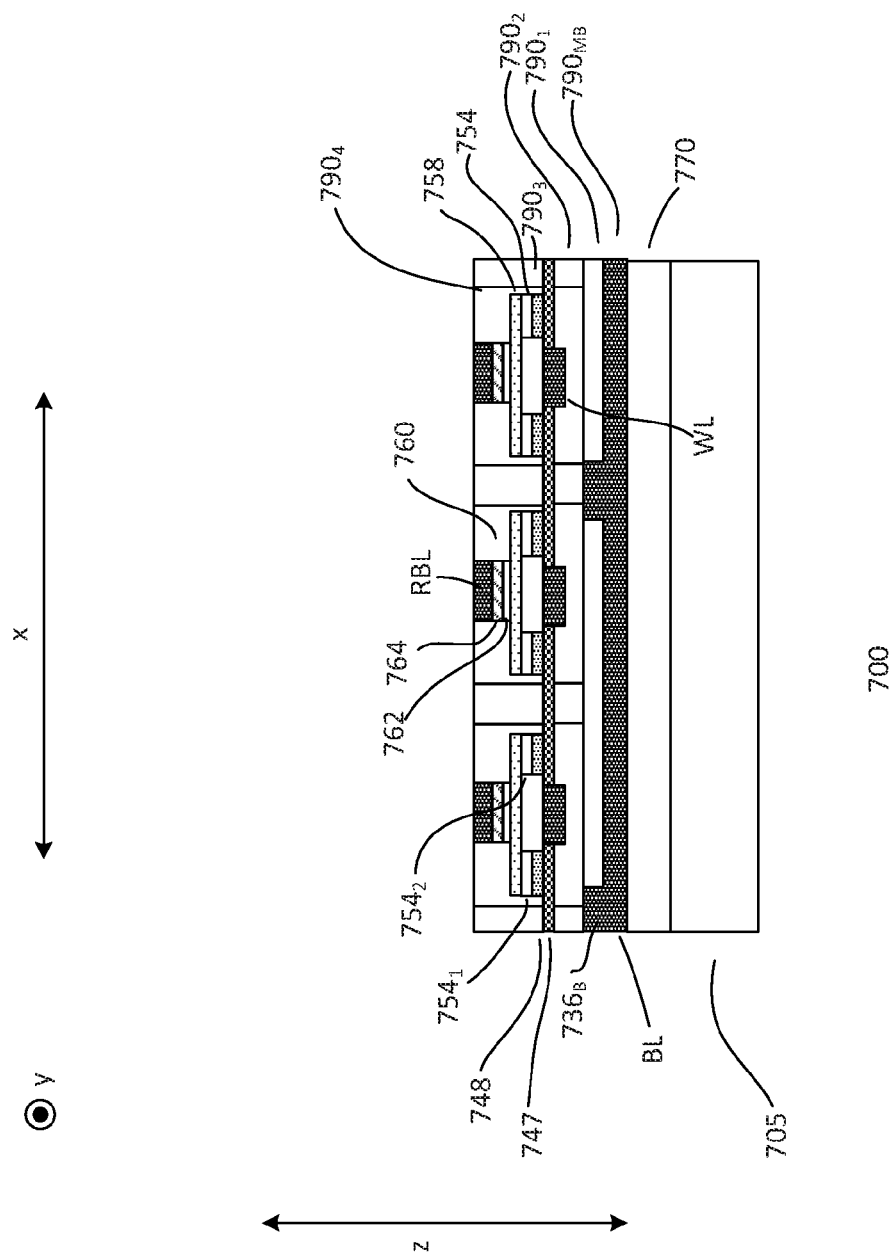

Referring to FIG. 7g, the free layer 758, reference stack 760 which may include a tunneling barrier layer 762 and a magnetic reference layer 764, and RBL of the memory cells are formed. A dielectric layer $790_4$ is formed on the substrate covering the RBL. The dielectric layer is planarized by, for example, CMP, leaving a planar surface with exposed RBLs. Forming the free layer, reference stack and RBL may be achieved as described in FIGS. 6g-6h. The RBLs, for example, extend the length of a row of memory cells in the y direction.

As shown, unstacked column of memory cells are formed. To form a memory array with unstacked columns, the process continues to FIG. 7i.

Figure 7H:
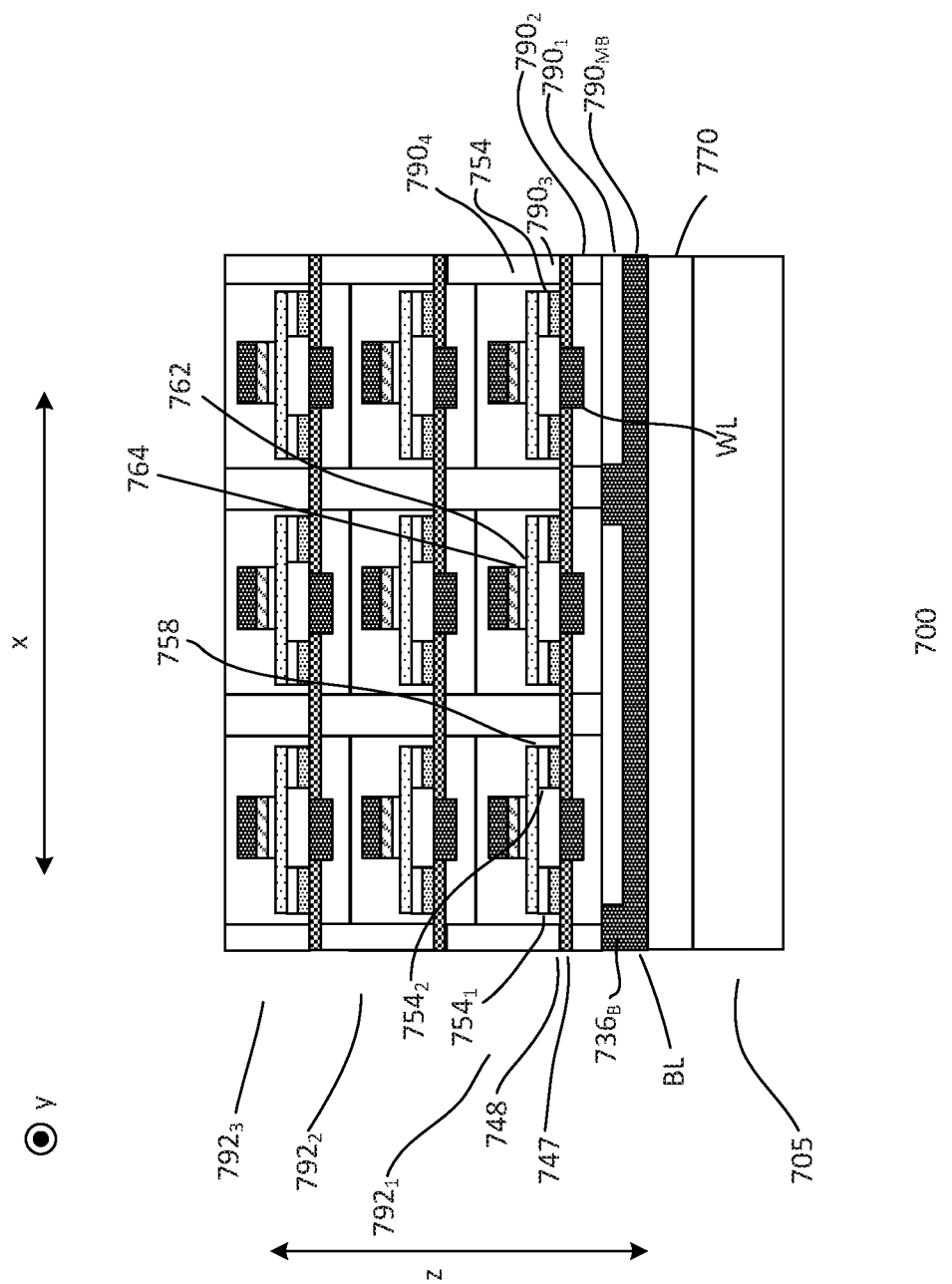

Referring to FIG. 7h, the process continues to form stacked columns of memory cells in the z direction. As shown, the array includes columns stack with three levels of memory cells. To form additional stacked levels, the process described in FIG. 7b, starting with forming dielectric layer $790_1$ to FIG. 7g, are repeated for each memory cell level. For example, the sequence is repeated twice to form columns with 3 levels of stacked memory cells in three dielectric levels, $792_1$-$792_3$ of the dielectric layer, as shown.

Figure 7I:
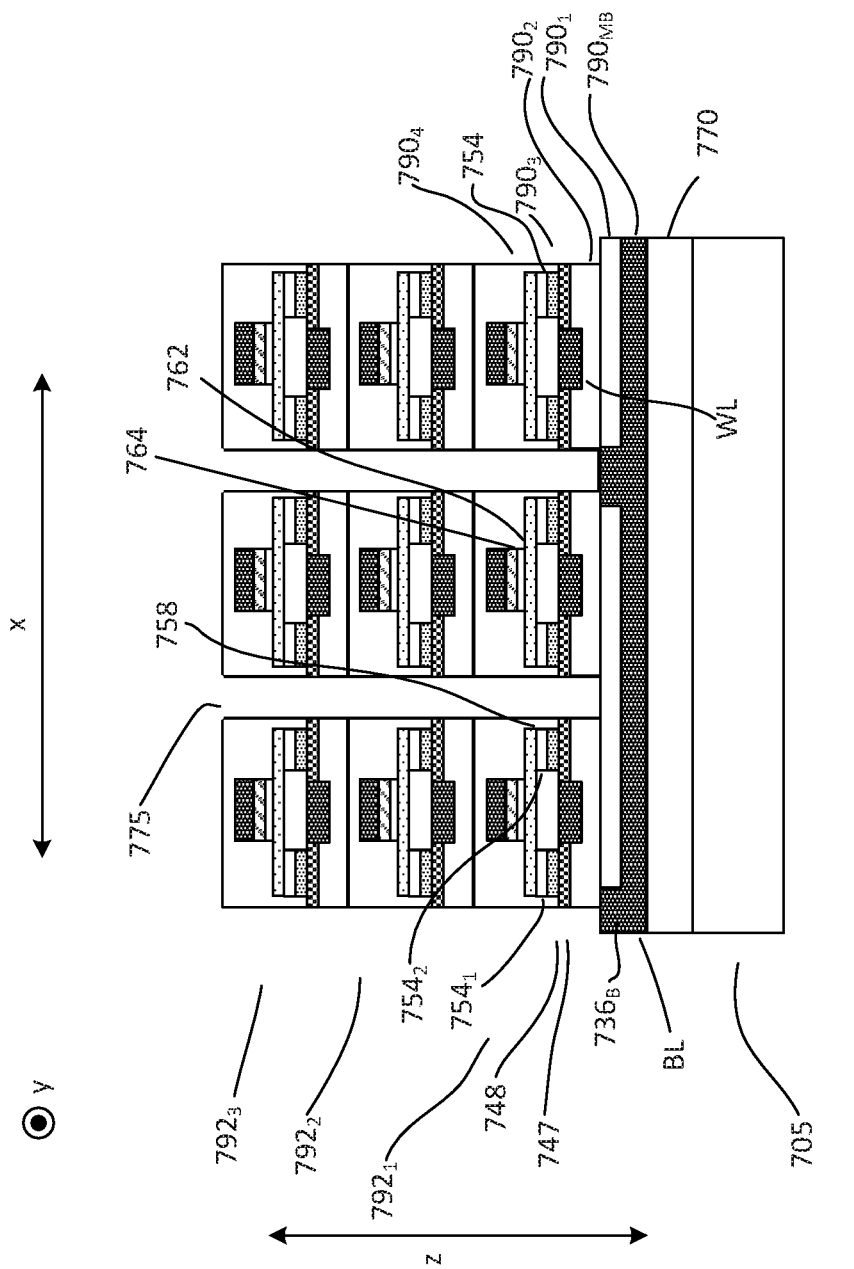

In FIG. 7i, the dielectric layers are patterned to form openings 775 which separate second polarity type doped layers into separate base terminals of BJTs for different storage units. This also exposes the bottom steps $736_B$ of the bottom bitlines. The openings, for example, are similar to deep via openings extending through the dielectric layers of the memory cells. Forming the openings may be achieved using mask and etch techniques. For example, a patterned resist mask may be employed by an RIE to form the openings. In the case of non-stacked memory cells, the process is the same except the etch is shorter due to less dielectric material to remove.

Figure 7J:
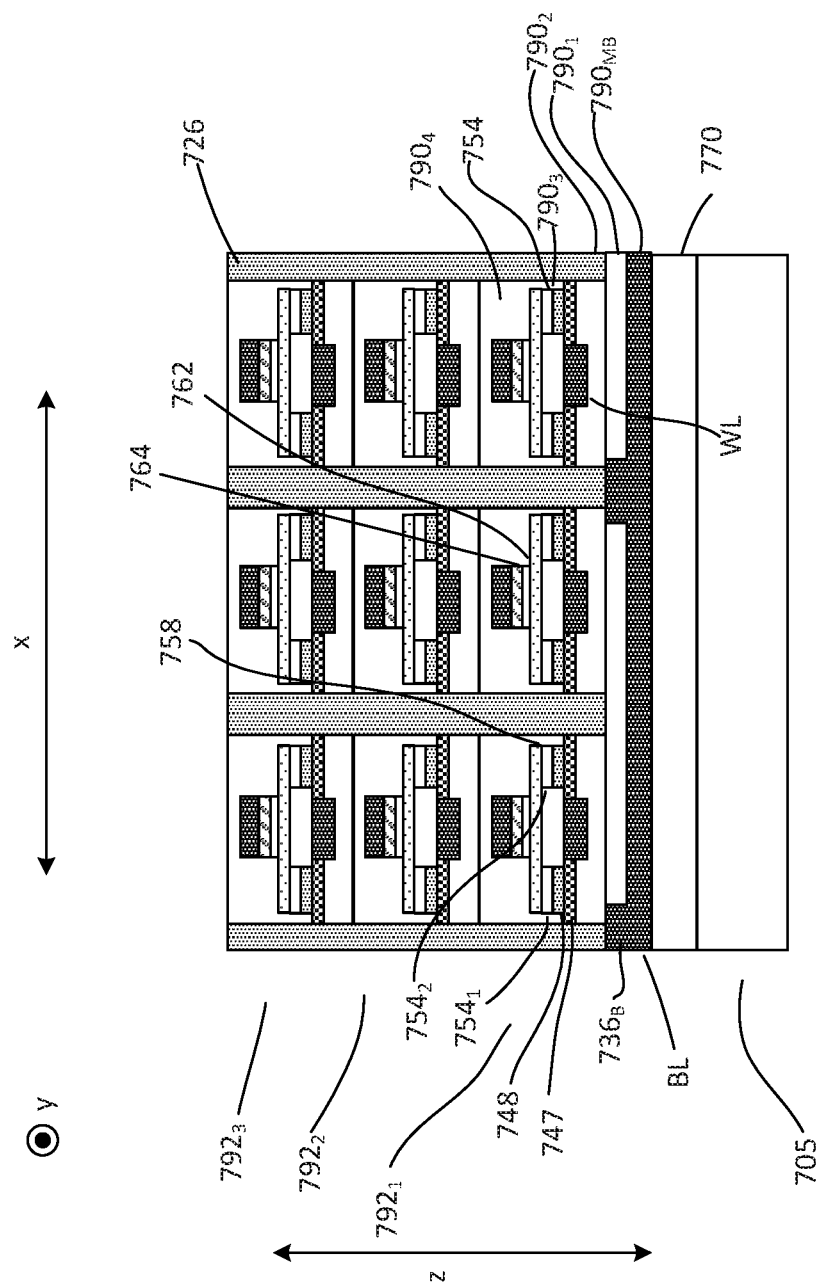

Referring to FIG. 7j, a doped layer 726 is formed on the substrate, filling the openings and covering the top level of the memory cells. The doped layer is a heavily doped layer with first polarity type dopants. The doped layer may be, for example, a heavily doped silicon layer with first polarity type dopants. The silicon layer, for example, may be polysilicon. Other types of silicon or semiconductor layers may also be useful. The doped layer may be formed by, for example, CVD using in-situ doping. The first polarity type doped layer may serve as third (collector or emitter) terminals of BJT selectors of the memory cells. The first polarity type doped layer of, for example, the first selectors of the select units contact the bottom bitline. Excess material of the doped layer are removed by, for example, CMP, forming a planar top surface with exposed top surfaces of the doped layer in the openings.

Figure 7K:
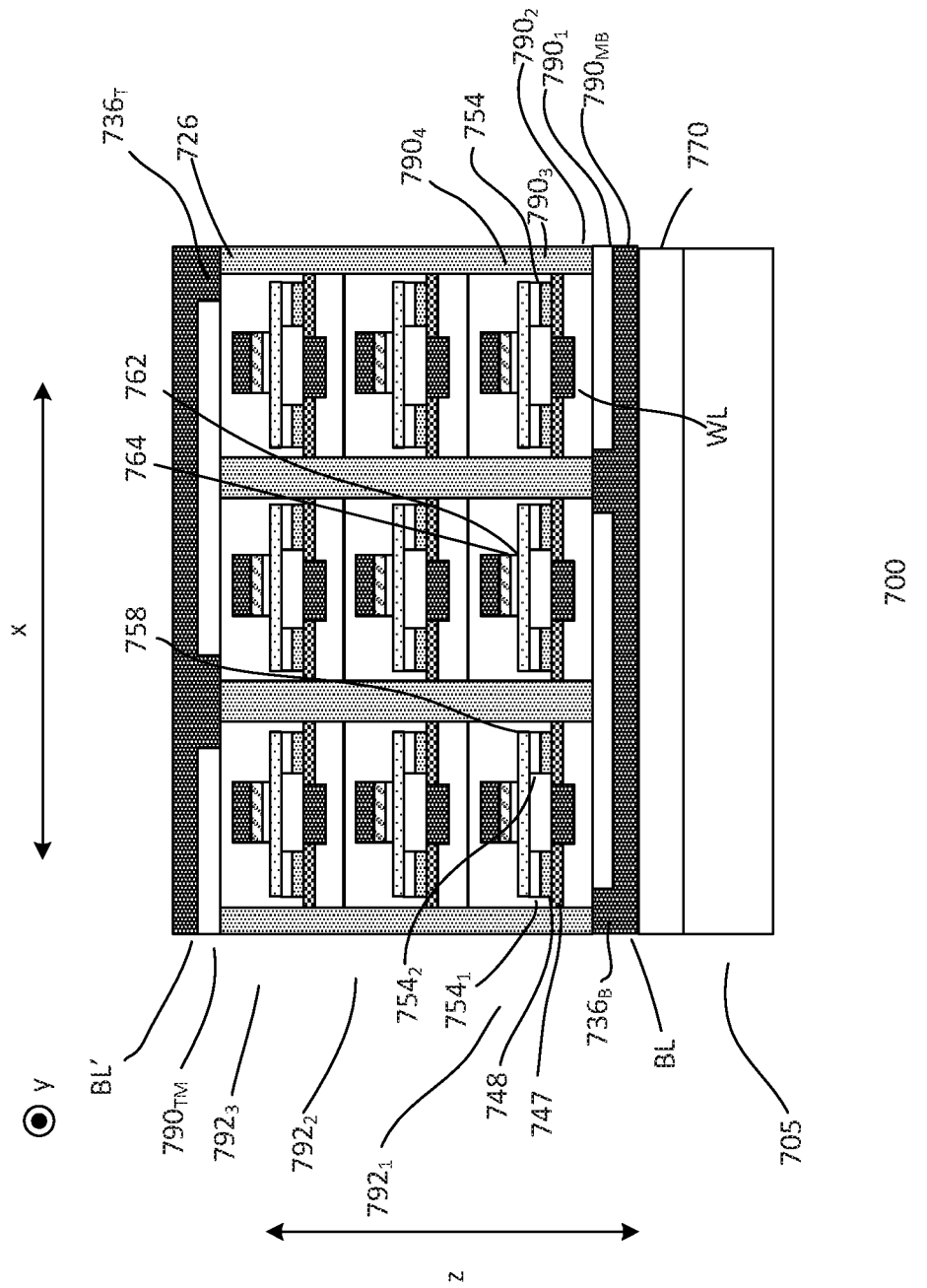

As shown in FIG. 7k, the process forms top bitlines. The top bitlines, for example, may be BL's. As shown, the top bitline includes top steps $736_T$ to facilitate coupling the third terminals of the second selectors of the select units to the top bitlines. In one embodiment, the top bitlines are formed in an ILD level $790_{TM}$ above the top stack of the memory cells. For example, the top steps are formed in the via level while the top bitlines are formed in the metal level. The steps and bitlines may be formed using dual damascene techniques. The steps and Mines, for example, are formed of copper or copper alloy. Other types of conductive materials may also be useful. Forming the top steps and top bitlines using other techniques may also be useful.

In another embodiment, the bottom bitlines do not include bottom steps, similar to that shown in FIG. 5b. The process is similar to that described in FIG. 7b except that the process for forming bottom steps is eliminated. When forming openings for the third terminals of the selector, two separate mask and etch steps are employed. For example, one process etches the third terminals of the first selectors of the select units while the other process etches the third terminals of the second selectors of the select units. The openings of the first selectors extend to the bottom bitline while the openings for the second selectors extend slightly below the second terminals but not to the bottom bitline. The top bitline may be formed as described in FIG. 7k.

In another embodiment, the bottom steps are formed from a heavily doped layer, similar to that shown in FIG. 5c. The heavily doped layer, for example, may be a silicon layer heavily doped with first polarity type dopants. The heavily doped layer may be formed and patterned to form bottom steps on the bottom bitline. A dielectric layer may be formed and planarized to expose the top of the bottom steps. Alternatively, the bottom steps may be formed by a damascene process in which the doped layer fills via openings. The excess doped layer is removed by CMP. The top bitlines may be formed as described in FIG. 7k.

In yet another embodiment, top steps of the top bitlines may be formed by a doped layer. The top steps may be formed similarly as the bottom steps. After the steps are formed, top bitlines are formed, for example, by a damascene process. Alternatively, the top bitlines may be formed by a RIE process.

As discussed, a plurality of memory cells may be formed and interconnected to form a 3-D stack memory array. For example, the memory cells are coupled in the x direction by BLs and BL's and in the y direction by WLs and RBLs and are stacked vertically in multiple levels in the z-direction to form the 3-D stack memory array, similar or the same as that shown in FIG. 3d.

Additional processes may be performed to complete forming the device. For example, the processes may include forming additional ILD levels, pad level, passivation level, pad opening, dicing, assembly and testing. Other types of processes may also be performed.

The embodiments as described result in various advantages. The embodiments as described form compact DW MRAM cell structure, allowing high density memory array to be formed. Moreover, higher drive current and scalability are achieved using BJT selectors. Furthermore, isolated transistors for each pinning layer eliminate sneak path or disturbance, allowing for more reliable memory device to be formed. Additionally, the processes as described are highly compatible with logic processing or technology. This avoids investment of new tools and does not require creating new low temperature modules or processing, providing a cost effective solution to form high density memory array.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a memory cell comprising:
   providing a substrate with a cell region;
   forming a selector unit in the cell region, wherein the selector unit includes first and second bipolar junction transistors (BJTs), wherein the first and second BJTs each comprises first, second and third BJT terminals; and
   forming a storage unit over the selector unit, wherein forming the storage unit comprises
      forming a first pinning layer, the first pinning layer is coupled to the first BJT terminal of the first BJT,
      forming a second pinning layer, the second pinning layer is coupled to the first BJT terminal of the second BJT, and
      disposing a free layer over the first and second pinning layers, the free layer includes an elongated member with first and second major surfaces and first and second end regions separated by a free region, wherein the first pinning layer is coupled to the second major surface of the free layer in the first end region, the second pinning layer is coupled to the second major surface of the free layer in the second end region.

2. The method of claim 1 wherein:
   the first BJT terminal of the first BJT serves as a first read bitlines for a memory cell;
   the first BJT terminal of the second BJT serves as a second read bitlines for a memory cell;
   the second BJT terminals of the first and second BJTs are coupled to or serve as a common wordline terminal;
   the third BJT terminal of the first BJT serves as a first bitline terminal; and
   the third BJT terminal of the second BJT serves as a second bitline terminal.

3. A method for forming a memory cell comprising:
providing a substrate with a cell region;
forming a selector unit in the cell region, wherein the selector unit includes first and second bipolar junction transistors (BJTs), the first and second BJTs each comprises first, second and third BJT terminals, wherein
the second BJT terminals of the first and second BJTs are coupled to or serve as a common wordline terminal,
the third BJT terminal of the first BJT serves as a first bitline terminal, and
the third BJT terminal of the second BJT serves as a second bitline terminal; and
forming a storage unit over the selector unit, wherein the storage unit comprises
a first pinning layer, the first pinning layer is coupled to the first BJT terminal of the first BJT,
a second pinning layer, the second pinning layer is coupled to the first BJT terminal of the second BJT, and
a free layer, the free layer includes an elongated member with first and second major surfaces and first and second end regions separated by a free region, wherein
the first pinning layer is coupled to the second major surface of the free layer in the first end region,
the second pinning layer is coupled to the second major surface of the free layer in the second end region, and
a reference stack is disposed on the first major surface of the free layer in the free region, wherein the reference stack serves as a read bitline terminal.

4. The method of claim 3 wherein forming the selector unit comprises forming the selector unit in the substrate.

5. The method of claim 3 wherein:
the substrate is prepared with a cell isolation region separating the isolation region into first and second BJT regions and a cell doped region comprises second polarity type dopants; and
forming the selector unit comprises
forming first doped layers in the cell region, the first doped layers are doped with first polarity type dopants, the first doped layers form the third BJT terminals of the first and second BJTs of the selector unit, wherein the third BJT terminals are separated by the cell isolation region and cell doped region,
forming second doped layers in the substrate over on the first doped layers, the second doped layers are doped with second polarity type dopants, the second doped layers serve as a common second BJT terminal of the first and second BJTs of the selector unit, and
forming third doped layers having first polarity type dopants, the third doped layers are disposed over the second doped layers and isolated from each other, the third doped layers serve as the first BJT terminals of the first and second BJTs of the selector unit.

6. The method of claim 3 wherein forming the storage unit comprises:
forming a pinning layer on a base dielectric layer;
patterning the pinning layer to form first and second patterned pinning layers;
depositing a pinning dielectric layer over the base dielectric layer and patterned pinning layers;
planarizing the substrate to form a planar top surface between the pinning dielectric layer and patterned pinning layers;
forming a free layer on the substrate over the pinning dielectric layer and pinning layers;
patterning the free layer to form a patterned free layer having first and second end regions coupled to the first and second pinning layers, wherein a free region is disposed between the end regions of the free layer;
depositing a free dielectric layer over the pinning dielectric layer and patterned free layer;
planarizing the substrate to form a planar top surface between the free dielectric layer and the patterned free layer;
forming a reference stack on the substrate over the free dielectric layer and patterned free layer;
patterning the reference stack on the substrate to form a patterned reference stack;
forming a reference dielectric layer over the substrate covering the free dielectric layer and patterned reference stack; and
planarizing the substrate to form a planar top surface between the reference dielectric layer and the patterned reference stack.

7. The method of claim 3 wherein:
the selector unit and storage unit are formed in a cell dielectric layer disposed over a base dielectric layer formed on the substrate; and
the base dielectric layer isolates the cell dielectric layer from the substrate.

8. The method of claim 5 wherein:
the first and second doped layers are doped regions in the substrate; and
forming the third doped layers comprises forming doped epitaxial layers on the substrate in the cell region.

9. The method of claim 5 wherein:
the first doped layers extend in a column direction to form first and second bitlines for a column of memory cells;
the second doped layers extend in a wordline direction and form a common second doped layers for the first and second BJTs of the storage unit and form a wordline for a row of memory cells; and
the third doped layers extend in the column direction to form first and second read bitlines for a column of memory cells.

10. The method of claim 6 wherein forming the reference stack comprises forming a reference layer over a tunneling barrier layer.

11. The method of claim 6 comprises forming a read bitline coupled to the reference stack.

12. The method of claim 6 wherein:
the base dielectric layer comprises a metal level dielectric layer and a contact level dielectric layer disposed over the selector unit;
first and second contacts in the contact level dielectric coupled to the first terminals of the first and second BJTs of the selector unit; and
first and second metal pads in the metal level dielectric level, the first and second metal pads coupled to first and second contacts, wherein the first and second metal pads are coupled to first and second pinning layers.

13. The method of claim 7 wherein forming the selector unit comprises:
forming a bottom bitline on the base dielectric layer, the bottom bitline extends in a column direction, the bottom bitline is formed in a bottom bitline metal dielectric level, wherein the bottom bitline includes a conductive bottom step elevated from the bottom bitline;
forming a first storage dielectric layer on the substrate over the bottom step;
forming a second storage dielectric layer on the substrate over the first storage dielectric layer; and
forming the selector unit and storage unit comprising
forming a second doped layer with second polarity type dopants on the second storage dielectric layer,
patterning the second doped layer to form an elongated member along the column direction,
forming a dielectric layer over the patterned second doped layer,
planarizing the substrate to form a planar top surface between the dielectric layer and patterned second doped layer,
forming a wordline in a row direction, the wordline extends a partial depth into the first storage dielectric layer and has a coplanar surface with the patterned second doped layer,
forming a first doped semiconductor layer doped with first polarity type dopants over the wordline and second doped layer,
patterning the first doped layer to form first and second pinning layers,
forming a third storage dielectric layer on the substrate,
planarizing the substrate to form a planar surface between the third storage dielectric layer and first and second pinning layers,
forming a patterned free layer over the pinning layers, wherein first and second end portions of the patterned free layer are coupled to the first and second pinning layers and a free region is disposed between the end portions,
depositing a fourth storage dielectric layer over the patterned free layer,
planarizing the substrate to form a planar top surface between the fourth storage dielectric layer and the patterned free layer,
forming a patterned reference stack on the free region of the free layer,
forming a reference dielectric layer over the substrate covering the fourth dielectric layer and patterned reference stack,
planarizing the substrate to form a planar top surface between the reference dielectric layer and the patterned reference stack,
forming a read bitline in the column direction in contact with the reference stack, wherein the read bitline is formed in a read bitline dielectric layer, and
forming a fifth storage dielectric layer over the read bitline.

14. The method of claim 8 wherein forming the doped epitaxial layers comprises selective epitaxial growth.

15. The method of claim 8 wherein the doped epitaxial layers are in-situ doped epitaxial layers.

16. The method of claim 10 wherein:
the tunneling barrier layer is formed over the free layer prior to patterning the free layer; and
patterning the tunnel barrier and free layers.

17. The method of claim 13 further comprises:
patterning the storage dielectric layers to form first and second via openings, wherein the first and second via openings are in communication with the second doped layer and the first via opening is also in communication with the bottom step of the bottom bitline;
filling the via openings with a third doped layer having first polarity type dopants;
planarizing the substrate to form a planar surface between the third doped layer and the fifth storage dielectric layer, wherein the third doped layer in the first and second via openings serve as third terminals of the first and second BJTs of the selector unit; and
forming a top bitline in the column direction, wherein the top bitline includes a top step coupled to the third terminal of the second BJT in the second via opening.

18. The method of claim 13 further comprises:
repeating forming the selector unit and storage unit x times to form x stacked memory cells;
patterning the storage dielectric layers to form first and second via openings, wherein the first and second via openings are in communication with the second doped semiconductor layers of the stacked memory cells and the first via opening is also in communication with the bottom step of the bottom bitline;
filling the via openings with a third doped layer having first polarity type dopants;
planarizing the substrate to form a planar surface between the third doped layer and the fifth storage dielectric layer, wherein the third doped layer in the first and second via openings serve as third terminals of the first and second BJTs of the selector units of the stacked memory cells; and
forming a top bitline in the column direction, wherein the top bitline includes a top step coupled to the third terminals of the second BJTs of the selector units of the stacked memory cells in the second via opening.

19. A memory cell comprising:
a substrate with a cell region;
a selector unit in the cell region, wherein the selector unit includes first and second bipolar junction transistors (BJTs), wherein the first and second BJTs each comprises first, second and third BJT terminals; and
a storage unit disposed over the selector unit, the storage unit comprises
a first pinning layer, the first pinning layer is coupled to the first BJT terminal of the first BJT,
a second pinning layer, the second pinning layer is coupled to the first BJT terminal of the second BJT, and
a free layer disposed over the first and second pinning layers, the free layer includes an elongated member with first and second major surfaces and first and second end regions separated by a free region, wherein the first pinning layer is coupled to the second major surface of the free layer in the first end region, the second pinning layer is coupled to the second major surface of the free layer in the second end region.

20. The memory cell of claim 19 wherein:
the first BJT terminal of the first BJT serves as a first read bitline for a memory cell;
the first BJT terminal of the second BJT serves as a second read bitline for a memory cell;
the second BJT terminals of the first and second BJTs are coupled to or serve as a common wordline terminal;
the third BJT terminal of the first BJT serves as a first bitline terminal; and
the third BJT terminal of the second BJT serves as a second bitline terminal.

21. The memory cell of claim 19 wherein the selector unit is disposed in the substrate and the storage unit is disposed in a storage dielectric layer disposed over the substrate.

22. The memory cell of claim 20 comprising:
a base dielectric layer disposed over the substrate;
a cell dielectric layer disposed over the base dielectric layer, wherein the selector unit and storage unit are disposed in a cell dielectric layer;
a bottom bitline disposed below the cell dielectric layer, the bottom bitline is coupled to the first terminal of the first BJT; and
a top bitline disposed over the cell dielectric layer, the top bitline is coupled to the first terminal of the second BJT.

23. The memory cell of claim 20 comprises:
a base dielectric layer disposed over the substrate;
a plurality of cell dielectric layers disposed over the base dielectric layer, wherein each cell dielectric layer includes the selector unit and storage unit to form a plurality of stacked memory cells;
a bottom bitline disposed below the plurality of cell dielectric layers, the bottom bitline is coupled to the first terminal of the first BJT of the stacked memory cells; and
a top bitline disposed over the plurality of cell dielectric layers, the top bitline is coupled to the first terminal of the second BJT of the stacked memory cells.

24. A memory cell comprising:
a substrate with a cell region;
a selector unit in the cell region, wherein the selector unit includes first and second bipolar junction transistors (BJTs), the first and second BJTs each comprises first, second and third BJT terminals, wherein
the second BJT terminals of the first and second BJTs are coupled to or serve as a common wordline terminal,
the third BJT terminal of the first BJT serves as a first bitline terminal, and
the third BJT terminal of the second BJT serves as a second bitline terminal; and
a storage unit disposed over the selector unit, wherein the storage unit comprises
a first pinning layer, the first pinning layer is coupled to the first BJT terminal of the first BJT,
a second pinning layer, the second pinning layer is coupled to the first BJT terminal of the second BJT, and
a free layer disposed over the pinning layers, the free layer includes an elongated member with first and second major surfaces and first and second end regions separated by a free region, wherein
the first pinning layer is coupled to the second major surface of the free layer in the first end region,
the second pinning layer is coupled to the second major surface of the free layer in the second end region, and
a reference stack disposed on the first major surface of the free layer in the free region, wherein the reference stack serves as a read bitline terminal.

\* \* \* \* \*